(12) United States Patent
Kiyokawa

(10) Patent No.: US 12,721,106 B2
(45) Date of Patent: Aug. 25, 2026

(54) SUBSTRATE PROCESSING APPARATUS AND TRANSFER METHOD

(71) Applicant: Tokyo Electron Limited, Tokyo (JP)

(72) Inventor: Takayasu Kiyokawa, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 419 days.

(21) Appl. No.: 18/242,021

(22) Filed: Sep. 5, 2023

(65) Prior Publication Data

US 2023/0420286 A1 Dec. 28, 2023

Related U.S. Application Data

(63) Continuation of application No. PCT/JP2022/009217, filed on Mar. 3, 2022.

(30) Foreign Application Priority Data

Mar. 5, 2021 (JP) ................................. 2021-035527

(51) Int. Cl.
*H10P 72/76* (2026.01)
*B25J 9/10* (2006.01)
(Continued)

(52) U.S. Cl.
CPC ............ *H10P 72/7602* (2026.01); *B25J 9/10* (2013.01); *B25J 9/1664* (2013.01);
(Continued)

(58) Field of Classification Search
CPC ......... H01L 21/68707; H01L 21/67167; H01L 21/67196; H01L 21/67742;
(Continued)

(56) References Cited

U.S. PATENT DOCUMENTS 6,032,083 A * 2/2000 Oosawa ............ H01L 21/68707 700/218
2002/0038997 A1* 4/2002 Sakai ........................ C02F 3/04 445/24

(Continued)

FOREIGN PATENT DOCUMENTS

CN 106340479 A 1/2017
JP 2001022423 A * 1/2001

(Continued)

OTHER PUBLICATIONS

International Search Report and Written Opinion mailed on Jun. 7, 2022, received for PCT Application PCT/JP2022/009217, filed on Mar. 3, 2022, 8 pages including English Translation.

*Primary Examiner* — Ernesto A Suarez
*Assistant Examiner* — Laurence R Brothers
(74) *Attorney, Agent, or Firm* — XSENSUS LLP

(57) ABSTRACT

There is provided a substrate processing apparatus comprising: a first placement chamber; a second placement chamber; a transfer robot; and a controller. The controller is configured to: a) control the apparatus such that a position of an object on a fork of the transfer robot is detected as a first position when unloading the object from the first placement chamber; b) control the apparatus such that the object is unloaded from the first placement chamber to a standby position of the first placement chamber and then transferred to a standby position of the second placement chamber; c) control the apparatus such that a position of the object on the fork is detected as a second position when loading the object to the second placement chamber; and d) control the apparatus such that a transfer speed of b) is controlled based on the first position and the second position.

8 Claims, 19 Drawing Sheets

(51) Int. Cl.

| | |
|---|---|
| ***B25J 9/16*** | (2006.01) |
| ***B25J 11/00*** | (2006.01) |
| ***B25J 13/08*** | (2006.01) |
| ***B25J 15/00*** | (2006.01) |
| ***B25J 19/02*** | (2006.01) |
| ***H10P 72/00*** | (2026.01) |
| ***H10P 72/30*** | (2026.01) |

(52) U.S. Cl.
CPC ........... *B25J 11/0095* (2013.01); *B25J 13/08* (2013.01); *B25J 15/0014* (2013.01); *B25J 19/02* (2013.01); *H10P 72/00* (2026.01); *H10P 72/0454* (2026.01); *H10P 72/0464* (2026.01); *H10P 72/0606* (2026.01); *H10P 72/30* (2026.01); *H10P 72/3302* (2026.01); *H10P 72/3304* (2026.01)

(58) Field of Classification Search
CPC ............... H01L 21/67745; H01L 21/67; H01L 21/67259; H01L 21/677; B25J 9/10; B25J 9/1664; B25J 11/0095; B25J 13/08; B25J 15/0014; B25J 19/02
See application file for complete search history.

(56) References Cited

U.S. PATENT DOCUMENTS

2002/0045011 A1 * 4/2002 Nagashima ......... H01L 21/6715 427/372.2
2004/0168633 A1 * 9/2004 Nozawa ............ H01L 21/67259 118/719

FOREIGN PATENT DOCUMENTS

JP 2001-219390 A 8/2001
JP 2006-080198 A 3/2006
JP 2019057738 A * 4/2019

* cited by examiner

FIG. 6

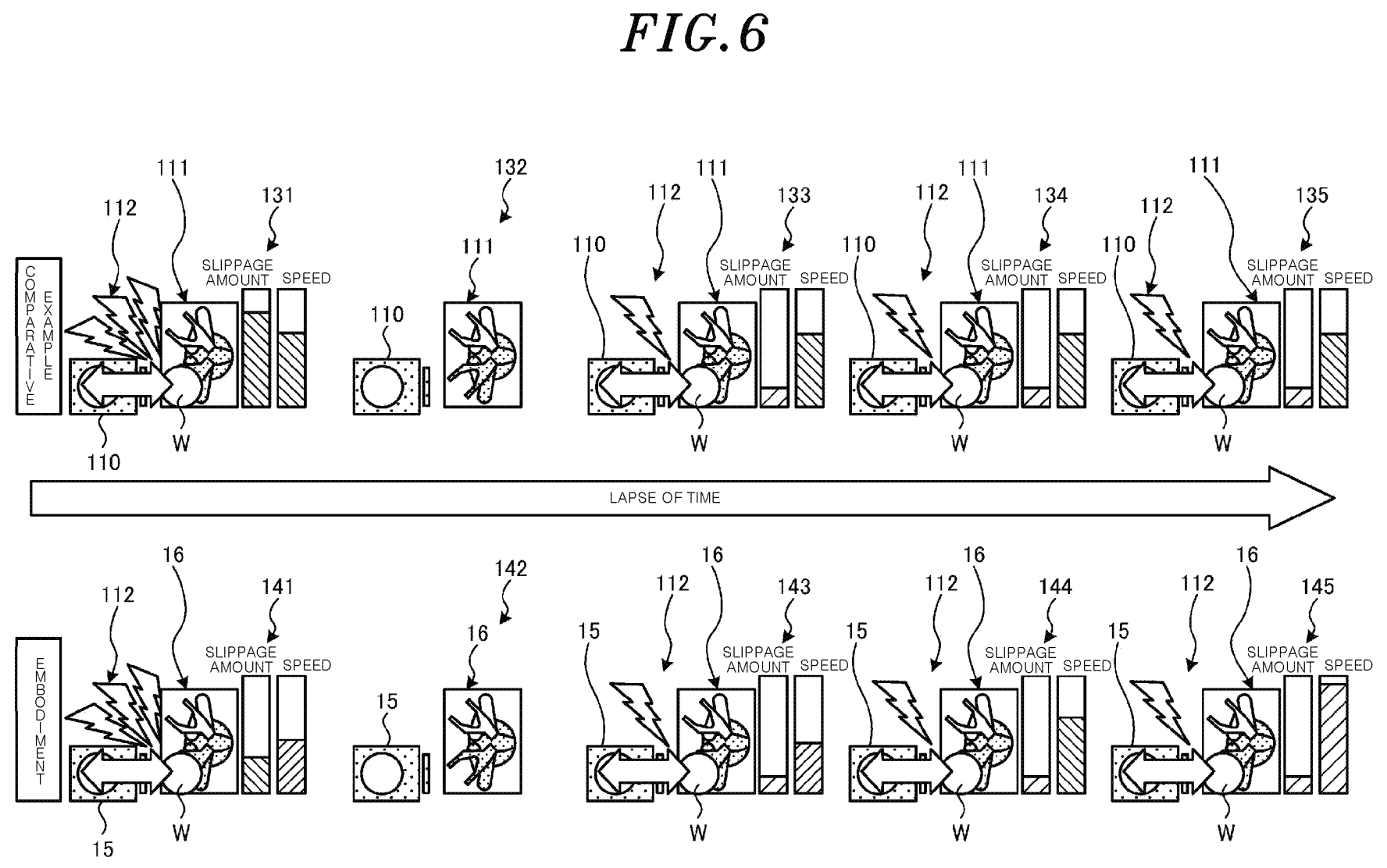

COMPARATIVE EXAMPLE

EMBODIMENT

LAPSE OF TIME

SLIPPAGE AMOUNT

SPEED 110 111 112 131 132 133 134 135 W 15 16 112 141 142 143 144 145 W

*FIG. 7*
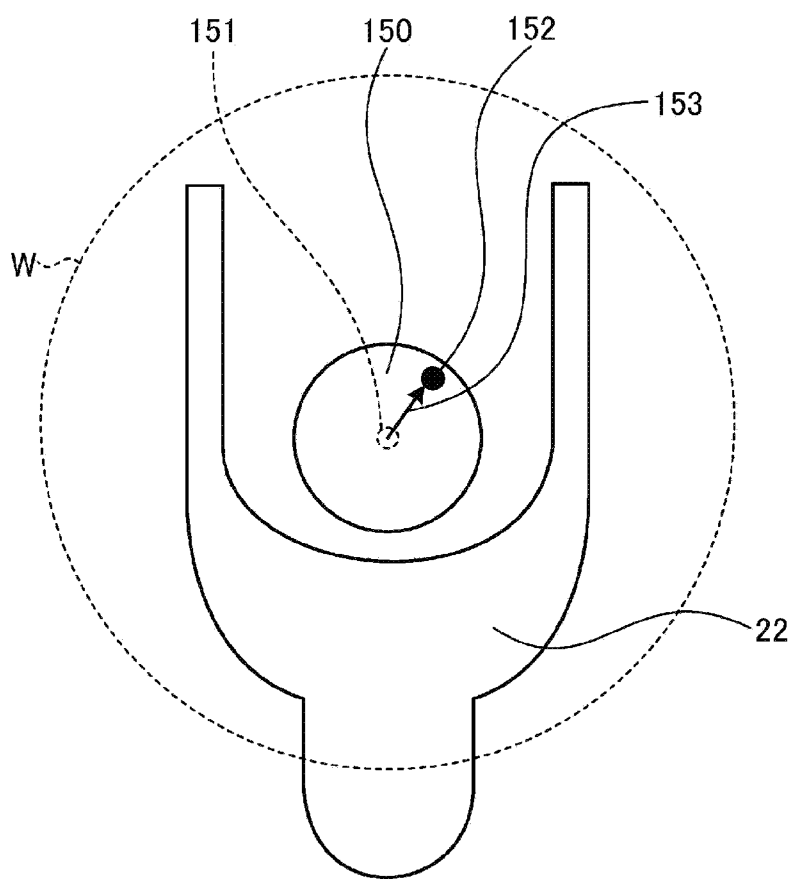
*FIG. 8A* *FIG. 8B* *FIG. 8C*
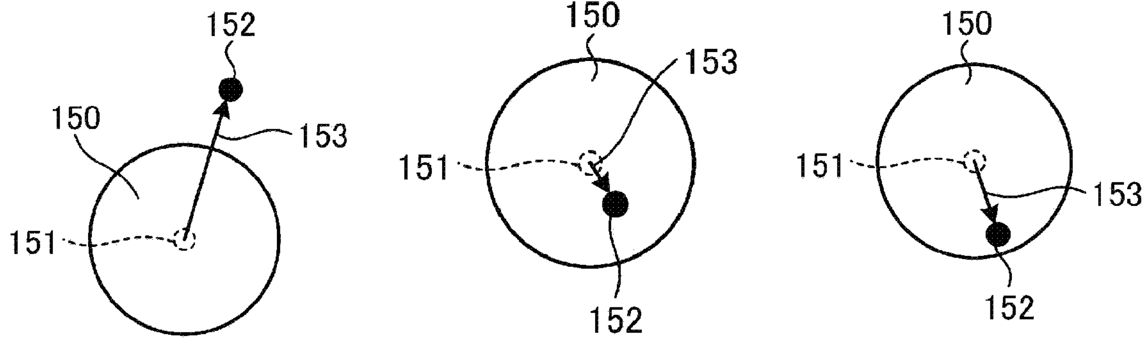

160

| SPEED COEFFICIENT | 100% (MAXIMUM SPEED) | X% | A% | B% | C% |
|---|---|---|---|---|---|
| Get OPERATION | 0.70[G] | Xg[G] | 0.4[G] | Bg[G] | Cg[G] |
| Put OPERATION | 0.71[G] | Xp[G] | Ap[G] | 0.4[G] | Cp[G] |
| Move OPERATION | 0.66[G] | 0.41[G] | Am[G] | Bm[G] | 0.4[G] |

161

| | Get | Move | Put | ACCELERATION [G] |
|---|---|---|---|---|
| LLM13a→PM15a | S2 | S6 | S10 | 0.48 |
| PM15a→PM15b | S8 | S12 | S16 | 0.38 |
| PM15b→LLM13a | S14 | S18 | S4 | 0.3 |

| STEP | FORK | OPERATION | ACCELERATION OF WAFER W [G] | DEVIATION AMOUNT IN X-AXIS FROM REFERENCE POSITION OF FORK 22L [mm] | DEVIATION AMOUNT IN Y-AXIS FROM REFERENCE POSITION OF FORK 22L [mm] | DEVIATION AMOUNT IN X-AXIS FROM REFERENCE POSITION OF FORK 22R [mm] | DEVIATION AMOUNT IN Y-AXIS FROM REFERENCE POSITION OF FORK 22R [mm] |
|---|---|---|---|---|---|---|---|
| S1 | 22L | | 0.3 | EMPTY | EMPTY | HOLD | HOLD |
| S2 | 22L | Get | 0.3 | 0.051 | 0.033 | HOLD | HOLD |
| S3 | 22L,22R | Change | 0.3 | HOLD | HOLD | HOLD | HOLD |
| S4 | 22R | Put | 0.3 | HOLD | HOLD | 0.034 | 0.059 |
| S5 | 22R | | 0.48 | HOLD | HOLD | EMPTY | EMPTY |
| S6 | 22L | Move | 0.49↑ | HOLD | HOLD | EMPTY | EMPTY |
| S7 | 22R | | 0.48 | HOLD | HOLD | EMPTY | EMPTY |
| S8 | 22R | Get | 0.38 | HOLD | HOLD | 0.066 | 0.078 |
| S9 | 22L,22R | Change | 0.38 | HOLD | HOLD | HOLD | HOLD |
| S10 | 22L | Put | 0.38 | 0.051 | 0.033 | HOLD | HOLD |
| S11 | 22L | | 0.38 | EMPTY | EMPTY | HOLD | HOLD |
| S12 | 22R | Move | 0.39↑ | EMPTY | EMPTY | HOLD | HOLD |
| S13 | 22L | | 0.38 | EMPTY | EMPTY | HOLD | HOLD |
| S14 | 22L | Get | 0.31 | 0.072 | 0.053 | HOLD | HOLD |
| S15 | 22L,22R | Change | 0.31 | HOLD | HOLD | HOLD | HOLD |
| S16 | 22R | Put | 0.31 | HOLD | HOLD | 0.054 | 0.085 |
| S17 | 22R | | 0.31 | HOLD | HOLD | EMPTY | EMPTY |
| S18 | 22L | Move | 0.32↑ | HOLD | HOLD | EMPTY | EMPTY |

| STEP | OPERATION | ACCELERATION OF WAFER W [G] | DEVIATION AMOUNT IN X-AXIS FROM REFERENCE POSITION OF FORK [mm] | DEVIATION AMOUNT IN Y-AXIS FROM REFERENCE POSITION OF FORK [mm] |
|---|---|---|---|---|
| S21 | Get | 0.4 | 0.051 | 0.033 |
| S22 | Move | 0.41 ↑ | – | – |
| S23 | Put | 0.4 | 0.051 | 0.033 |
| S24 | DIFFERENCE IS SMALLER THAN OR EQUAL TO THRESHOLD → INCREASE TRANSFER SPEED | | | |
| S25 | Get | 0.41 | 0.066 | 0.078 |
| S26 | Move | 0.42 ↑ | – | – |
| S27 | Put | 0.41 | 0.082 | 0.091 |
| S28 | DIFFERENCE EXCEEDS THRESHOLD → DECREASE TRANSFER SPEED | | | |
| S29 | Get | 0.4 | 0.044 | 0.067 |
| S30 | Move | 0.41 ↑ | – | – |
| S31 | Put | 0.4 | 0.040 | 0.067 |
| S32 | DIFFERENCE EXCEEDS THRESHOLD → DECREASE TRANSFER SPEED | | | |

| STEP | FORK | OPERATION | ACCELERATION OF WAFER W [G] | DEVIATION AMOUNT IN X-AXIS FROM REFERENCE POSITION OF FORK 22L [mm] | DEVIATION AMOUNT IN Y-AXIS FROM REFERENCE POSITION OF FORK 22L [mm] | DEVIATION AMOUNT IN X-AXIS FROM REFERENCE POSITION OF FORK 22R [mm] | DEVIATION AMOUNT IN Y-AXIS FROM REFERENCE POSITION OF FORK 22R [mm] |
|---|---|---|---|---|---|---|---|
| S201 | 22L | | 0.3 | EMPTY | EMPTY | HOLD | HOLD |
| S202 | 22L | Get | 0.3 | HOLD | HOLD | HOLD | HOLD |
| S203 | 22L,22R | Change | 0.3 | HOLD | HOLD | HOLD | HOLD |
| S204 | 22R | Put | 0.3 | HOLD | HOLD | HOLD | HOLD |
| S205 | 22R | | 0.48 | HOLD | HOLD | EMPTY | EMPTY |
| S206 | 22L | Move | 0.49↑ | 0.051 | 0.033 | EMPTY | EMPTY |
| S207 | 22R | | 0.48 | HOLD | HOLD | EMPTY | EMPTY |
| S208 | 22R | Get | 0.38 | HOLD | HOLD | HOLD | HOLD |
| S209 | 22L,22R | Change | 0.38 | HOLD | HOLD | HOLD | HOLD |
| S210 | 22L | Put | 0.38 | HOLD | HOLD | HOLD | HOLD |
| S211 | 22L | | 0.38 | EMPTY | EMPTY | HOLD | HOLD |
| S212 | 22R | Move | 0.39↑ | EMPTY | EMPTY | 0.066 | 0.078 |
| S213 | 22L | | 0.38 | EMPTY | EMPTY | HOLD | HOLD |
| S214 | 22L | Get | 0.31 | HOLD | HOLD | HOLD | HOLD |
| S215 | 22L,22R | Change | 0.31 | HOLD | HOLD | HOLD | HOLD |
| S216 | 22R | Put | 0.31 | HOLD | HOLD | HOLD | HOLD |
| S217 | 22R | | 0.31 | HOLD | HOLD | EMPTY | EMPTY |
| S218 | 22L | Move | 0.32↑ | 0.072 | 0.053 | EMPTY | EMPTY |

*FIG. 17*

| STEP | OPERATION | ACCELERATION OF WAFER W [G] | DEVIATION AMOUNT IN X-AXIS FROM REFERENCE POSITION OF FORK [mm] | DEVIATION AMOUNT IN Y-AXIS FROM REFERENCE POSITION OF FORK [mm] |
|---|---|---|---|---|
| S221 | Get | 0.4 | – | – |
| S222 | Move | 0.41 ↑ | 0.051 | 0.033 |
| S223 | Put | 0.4 | – | – |
| S224 | REPEAT STEPS S221 TO S223 MULTIPLE TIMES AND ACQUIRE VERTEX DATA (DEVIATION AMOUNT) IN NORMAL DISTRIBUTION | | | |
| S225 | REPEAT STEP S224 MULTIPLE TIMES AND MONITOR TRANSITON OF VERTEX DATA (DEVIATION AMOUNT) | | | |
| S226 | CONTROL TRANSFER SPEED BASED ON VERTEX DATA (DEVIATION AMOUNT) IN STEP S225 | | | |

FIG. 18

SUBSTRATE PROCESSING APPARATUS AND TRANSFER METHOD

CROSS-REFERENCE TO RELATED APPLICATIONS

This application is a bypass continuation application of International Application No. PCT/JP2022/009217 having an international filing date of Mar. 3, 2022 and designating the United States, the International Application being based upon and claiming the benefit of priority from Japanese Patent Application No. 2021-035527, filed on Mar. 5, 2021, the entire contents of each are incorporated herein by reference.

TECHNICAL FIELD

The present disclosure relates to a substrate processing apparatus and a transfer method.

BACKGROUND

A substrate processing apparatus includes, for example, a substrate transfer chamber having therein a transfer robot for transferring a disc-shaped semiconductor wafer (hereinafter, also referred to as "wafer") W that is an example of a substrate, and a plurality of substrate processing chambers radially arranged around the substrate transfer chamber. In this substrate processing apparatus, the transfer robot loads and unloads the wafer W into and from each substrate processing chamber. When the wafer W is transferred, the wafer W held by a holder of the transfer robot may slip due to an acceleration at the time of acceleration and deceleration. Therefore, it is suggested to vacuum-attract the wafer W to the holder of the transfer robot (see Japanese Laid-open Patent Publication No. 2001-219390).

SUMMARY

The present disclosure provides a substrate processing apparatus and a transfer method capable of optimizing an operation speed of a transfer robot depending on the slippage amount of an object to be transferred.

One embodiment of the present disclosure A substrate processing apparatus comprises a first placement chamber, a second placement chamber, a transfer robot configured to load and unload an object to be transferred between the first placement chamber and the second placement chamber and a controller, wherein the controller is configured to: a) control the substrate processing apparatus such that a position of the object to be transferred on a fork of the transfer robot is detected as a first position at the time of unloading the object to be transferred from the first placement chamber; b) control the substrate processing apparatus such that the object to be processed is unloaded from the first placement chamber to a standby position of the first placement chamber and then transferred to a standby position of the second placement chamber; c) control the substrate processing apparatus such that a position of the object to be processed on the fork is detected as a second position at the time of loading the object to be transferred from the standby position of the second placement chamber into the second placement chamber; and d) control the substrate processing apparatus such that a transfer speed of b) is controlled based on the first position and the second position.

In accordance with the present disclosure, the operation speed of the transfer robot can be optimized depending on the slippage amount of the object to be transferred.

BRIEF DESCRIPTION OF THE DRAWINGS

FIG. 6 explains an example of comparison of relationship between a slippage amount of a wafer and a transfer speed in the case of performing maintenance.

FIG. 7 shows an example of an increase-allowable range of a transfer speed in the first embodiment.

FIGS. 8A to 8C show an example of a center-of-gravity position of a wafer in the increase-allowable range of the transfer speed.

FIG. 13 shows an example of measurement of a deviation amount of the transfer path in the first embodiment.

FIG. 14 shows an example of a speed control process in a specific transfer path in the first embodiment.

FIG. 16 shows an example of measurement of a deviation amount of the transfer path in the second embodiment.

FIG. 17 shows an example of a speed control process in a specific transfer path in the second embodiment.

FIG. 18 shows an example of a configuration of a substrate processing chamber in a third embodiment.

DETAILED DESCRIPTION

Hereinafter, embodiments of a substrate processing apparatus and a transfer method of the present disclosure will be described in detail with reference to the accompanying drawings. Further, the following embodiments are not intended to limit the present disclosure.

As described above, when a wafer W is transferred, the wafer W held by a holder of a transfer robot may slip due to an acceleration during acceleration or deceleration. The holder of the transfer robot that does not have a mechanism for vacuum-attracting the wafer W holds the wafer W using a pad made of resin or the like, for example. In this case, the slippage of the wafer W is suppressed by the frictional force of the pad. Since, however, whether or not the wafer W is likely to slip varies depending on the state of the wafer W, such as a temperature, a film on the backside, flatness, or the like, or the state of the pad, the operation speed of the transfer robot is set in consideration of a state in which the wafer W is most likely to slip and, thus, it is difficult to improve the operation speed. Therefore, it is expected to set the operation speed suitable for each state, that is, to optimize the operation speed of the transfer robot depending on the slippage amount of an object to be transferred such as a substrate or the like.

First Embodiment

<Configuration of Substrate Processing Apparatus 10>

Figure 1:
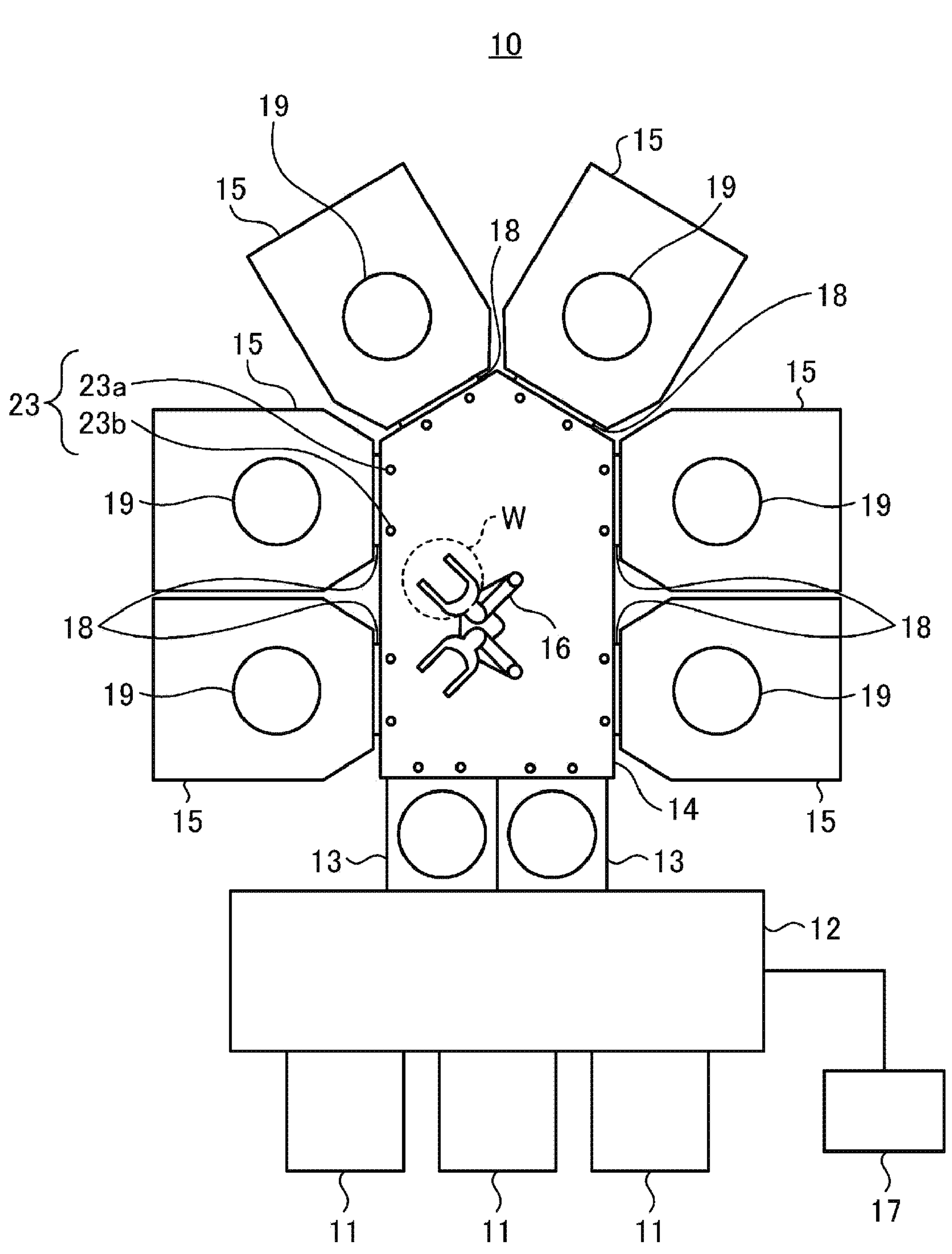
FIG. 1 is a schematic plan view showing an example of a substrate processing apparatus according to a first embodiment of the present disclosure.

FIG. 1 is a schematic plan view showing an example of a substrate processing apparatus according to a first embodiment of the present disclosure. The substrate processing apparatus 10 includes load ports 11, a loader chamber 12, load-lock chambers 13, a substrate transfer chamber 14, substrate processing chambers 15, and a controller 17.

A front opening unified pod (FOUP) (not shown), which is a carrier containing a predetermined number of wafers W with a diameter of φ300 mm, for example, is placed on each load port 11. Three load ports 11 are provided, for example. The loader chamber 12 is adjacent to the load ports 11, and loads and unloads the wafer W into and from the FOUP. The inside of the loader chamber 12 is constantly maintained in an atmospheric pressure atmosphere. A transfer robot (not shown) for transferring the wafer W is disposed in the loader chamber 12. The loader chamber 12 transfers the wafer W between the FOUP placed on the load port 11 and the load-lock chamber 13.

The load-lock chambers 13 are substrate transfer chambers, and are arranged on the opposite side of the load ports 11 with the loader chamber 12 interposed therebetween. The inner atmospheres of the load-lock chambers 13 can be selectively switched between a vacuum atmosphere and an atmospheric pressure atmosphere. The inner atmospheres of the load-lock chambers 13 are set to an atmospheric pressure atmosphere when the load-lock chambers 13 communicate with the loader chamber 12, and are set to a vacuum atmosphere when the load-lock chambers 13 communicate with the substrate transfer chamber 14. The load-lock chamber 13 serves as an intermediate transfer chamber for transferring the wafer W between the loader chamber 12 and the substrate transfer chamber 14. The load-lock chamber 13 is an example of a load-lock module (LLM).

The substrate transfer chamber 14 has, for example, a pentagonal shape in plan view, and is disposed on the opposite side of the loader chamber 12 with the load-lock chambers 13 interposed therebetween. Six substrate processing chambers are radially arranged around the substrate transfer chamber 14, and are connected to the substrate transfer chamber 14. A pressure in the substrate transfer chamber 14 is constantly maintained at a predetermined vacuum level. A transfer robot 16 for transferring the wafer W is disposed in the substrate transfer chamber 14. The transfer robot 16 transfers the wafer W between the substrate processing chambers 15, and between the substrate processing chamber 15 and the load-lock chamber 13. The substrate transfer chamber 14 is an example of a vacuum transfer module (VTM). The transfer robot 16 is an example of a substrate transfer mechanism.

The controller 17 is, for example, a computer, and includes a central processing unit (CPU), a random access memory (RAM), a read only memory (ROM), an auxiliary storage device, and the like. The CPU operates based on a program stored in the ROM or the auxiliary storage device, and controls operations of individual components of the substrate processing apparatus 10.

In the substrate processing apparatus 10, the substrate processing chambers 15 and the substrate transfer chamber 14 are connected through gate valves 18. The gate valves 18 control communication between the substrate processing chambers 15 and the substrate transfer chamber 14. A pressure in each substrate processing chamber 15 is maintained at a predetermined vacuum level. The wafer W is placed on a placing table 19 disposed in each substrate processing chamber and subjected to predetermined plasma processing, e.g., plasma etching. The substrate processing chamber 15 is an example of a process module PM.

Figure 2:
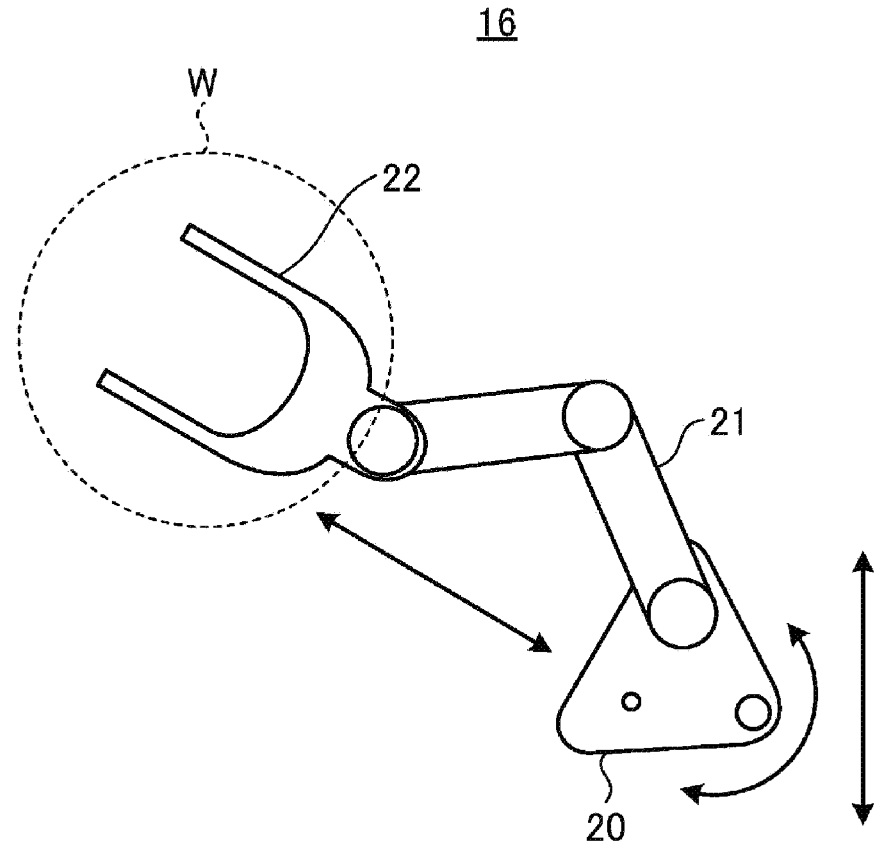
FIG. 2 is a schematic plan view showing an example of a configuration of a transfer robot of the first embodiment.

Next, the transfer robot 16 will be described with reference to FIG. 2. FIG. 2 is a schematic plan view showing an example of a configuration of a transfer robot of the first embodiment. As shown in FIG. 2, the transfer robot 16 includes a base 20 that has a substantially triangular shape in plan view and is rotatable on a horizontal plane, an articulated arm 21 that is horizontally extensible/contractible with respect to the base 20, and an articulated arm 21, and a fork 22 that has a substantially U shape viewed from the plane on which the wafer W is placed and is attached to the tip end of the articulated arm 21. The base 20 is configured to be movable in a horizontal direction, specifically in a vertical direction of FIG. 1. The transfer robot 16 incorporates three motors (not shown) for rotating and moving the base 20, and extending/contracting the articulated arm 21. The transfer robot 16 transfers the wafer W placed on the fork 22 to a desired location by rotating and moving the base 20 and extending/contracting the articulated arm 21.

When the plasma etching or the like is performed on the wafer W in the substrate processing chamber 15, it is required to accurately place the wafer W at a predetermined position on the placing table 19. Since, however, the position of the wafer W is adjusted by an alignment chamber (not shown) attached to the loader chamber 12, the position of the wafer W may be deviated from the desired position at the time of transferring the wafer W from the loader chamber 12 to the substrate processing chamber 15 via the load-lock chamber 13. For example, the position of the center of gravity of the wafer W may be deviated from the position of the center of gravity of the fork 22 due to the moment of inertia acting on the wafer W or the like. For example, the position of the wafer W may be deviated due to slippage caused by an acceleration at the time of acceleration and deceleration.

In order to measure the deviation amount of the wafer W from the desired position (hereinafter, also referred to as "deviation amount"), in the first embodiment, as shown in FIG. 1, multiple sensor pairs 23, each including two position sensors, are arranged in front of the substrate processing chambers 15. More specifically, the sensor pairs 23 are arranged to face the gate valves 18. Hereinafter, in one sensor pair 23, the position sensor on the right side of the substrate processing chamber 15 is referred to as "right sensor 23*a*" and the position sensor on the left side of the substrate processing chamber 15 is referred to as "left sensor 23*b*."

In each sensor pair 23, the right sensor 23*a* and the left sensor 23*b* are spaced apart from each other by a distance smaller than the diameter of the wafer W, and are arranged to face the backside of the wafer W transferred by the transfer robot 16. The right sensor 23*a* and the left sensor 23*b* detect the passage of the outer edge (hereinafter, also referred to as "edge") of the wafer W at the positions thereabove. The controller 17 calculates the position of the transfer robot 16 for the wafer W when the edge of the wafer W passes the position above the right sensor 23*a* or the left sensor 23*b*, specifically, the center-of-gravity position of the fork 22, from the encoder values of the three motors.

<Measurement of Deviation Amount of Wafer W>

FIGS. 3A to 3E explain an example of detection timing of the edge of the wafer by the sensor pair of the first embodiment. FIG. 4 explains an example of a method for acquiring the positions of the right sensor and the left sensor of the first embodiment.

Figure 3A:
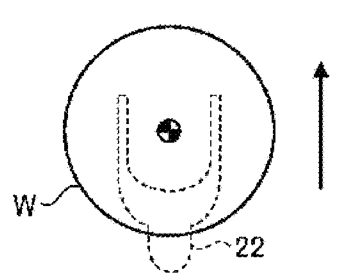
FIGS. 3A to 3E explain an example of timing of detecting an edge of a wafer by a sensor pair of the first embodiment.
Figure 3B:
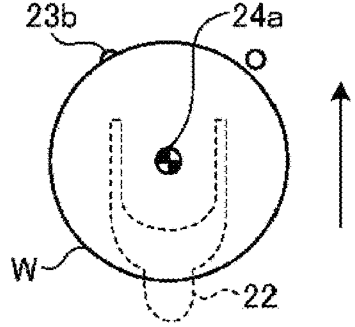
Figure 3C:
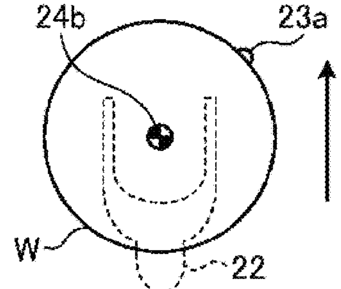
Figure 3D:
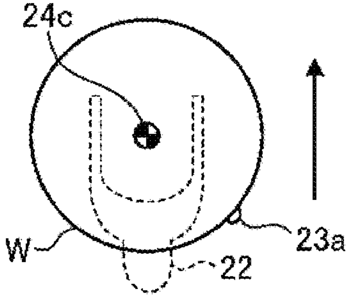
Figure 3E:
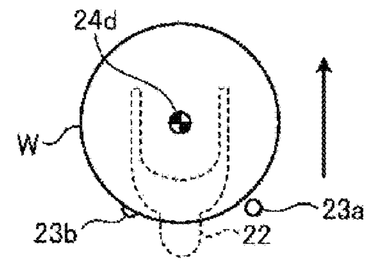
Figure 4:
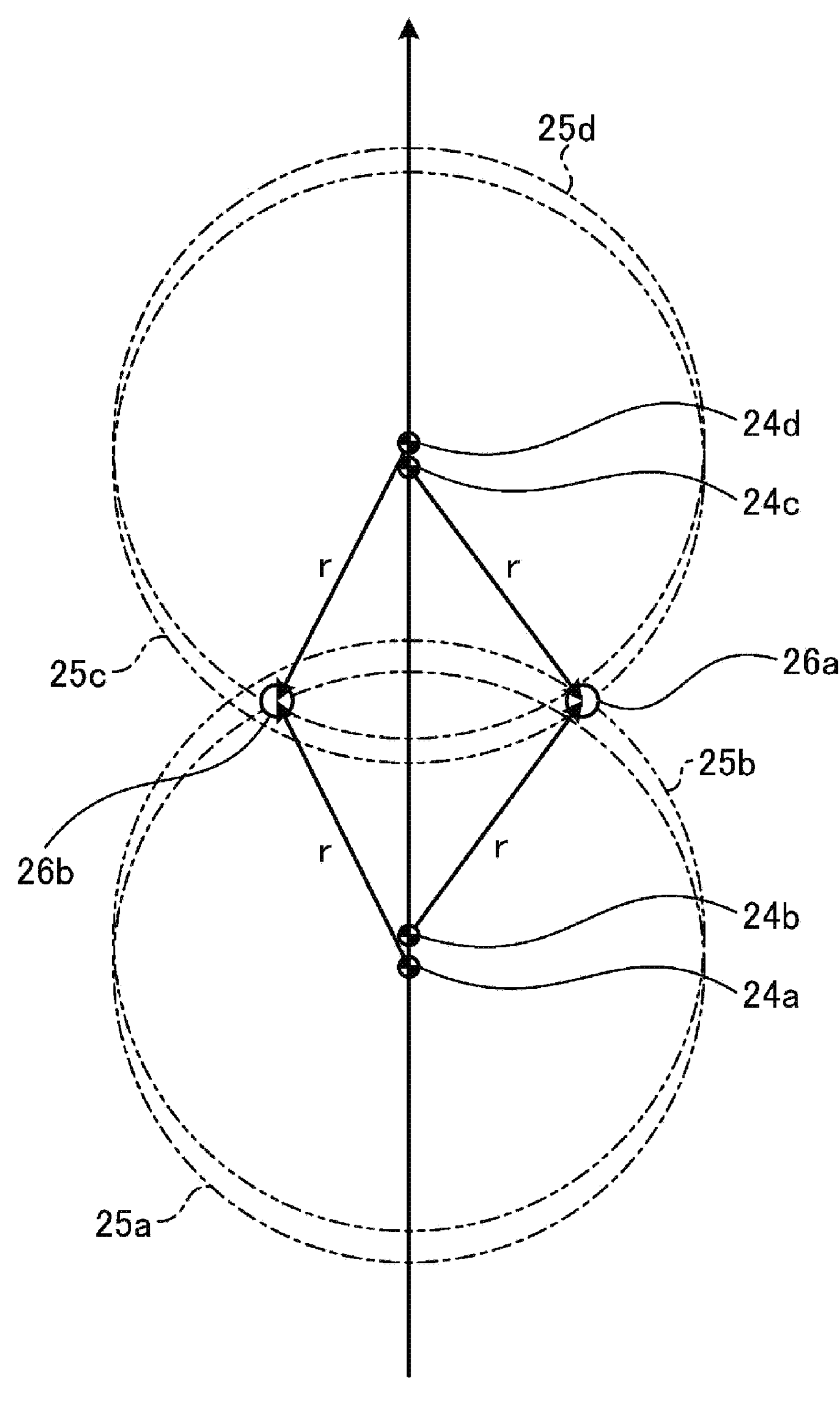
FIG. 4 explains an example of a method for acquiring a position of a right sensor and a position of a left sensor according to the first embodiment.

As shown in FIGS. 3A to 3E, when the sensor pair 23 is offset to the right side with respect to the transfer direction (indicated by arrows in FIGS. 3A to 3E) of the wafer W, first, the left edge of the wafer W passes through the position above the left sensor 23*b*, and a center-of-gravity position 24*a* of the fork 22 at this time is calculated (see FIG. 3B). Next, the right edge of the wafer W passes through the position above the right sensor 23*a*, and a center-of-gravity position 24*b* of the fork 22 at this time is calculated (see FIG. 3C). Then, the right edge of the wafer W passes through the position above the right sensor 23*a* again, and a center-of-gravity position 24*c* of the fork 22 at this time is calculated (see FIG. 3D). The left edge of the wafer W passes through the position above the left sensor 23*b* again, and a center-of-gravity position 24*d* of the fork 22 at this time is calculated (see FIG. 3E). In other words, when the wafer W passes through the position above the sensor pair 23, the center-of-gravity positions 24*a* to 24*d* of the four forks 22 are calculated.

Next, as shown in FIG. 4, the center-of-gravity positions 24*a* to 24*d* of the four forks 22 calculated in a coordinate system (hereinafter, also referred to as "transfer robot coordinate system") indicating the movement of the center-of-gravity positions of the forks 22 of the transfer robot 16 are plotted. First, two circles 25*a* and 25*d* (indicated by dash-dotted lines in FIG. 4) having the same radius r as the radius of the wafer W are drawn about the center-of-gravity positions 24*a* and 24*d* of the forks 22 at the time when the left sensor 23*b* passes through the position above the left edge of the wafer W. The intersection of the two circles 25*a* and 25*d* is obtained as a position 26*b* of the left sensor 23*b* in the transfer robot coordinate system. Further, two circles 25*b* and 25*c* (indicated by dashed double-dotted lines in FIG. 4) having the same radius r as the radius of the wafer W are drawn about the center-of-gravity positions 24*b* and 24*c* of the forks 22 at the time when the right sensor 23*a* passes through the position above the right edge of the wafer W. The intersection of the two circles 25*b* and 25*c* is obtained as a position 26*a* of the right sensor 23*a* in the transfer robot coordinate system.

In the case of measuring the deviation amount of the wafer W, the position of the right sensor 23*a* and the position of the left sensor 23*b* in the transfer robot coordinate system are acquired in advance as the reference right sensor position and the reference left sensor position, respectively. Next, the difference (deviation amount) between the reference right sensor position and the position 26*a* of the right sensor 23*a* is calculated. Here, the position 26*a* of the right sensor 23*a* depends on the position where the right sensor 23*a* and the right edge of the wafer W intersect, and the corresponding intersecting position depends on the position of the wafer W to be transferred. Therefore, the position 26*a* of the right sensor 23*a* reflects the position of the wafer W to be transferred. Accordingly, the deviation amount between the reference right sensor position and the position 26*a* of the right sensor 23*a* corresponds to the deviation amount of the wafer W. Hence, in the first embodiment, the deviation amount between the reference right sensor position and the position 26*a* of the right sensor 23*a* (the deviation amount of the position 26*a* detected by the right sensor 23*a* with respect to the reference right sensor position) is considered as the deviation amount of the wafer W.

Then, the position 26*b* of the left sensor 23*b* is acquired from the center-of-gravity positions 24*a* and 24*d* by the acquisition method of FIG. 4. Further, the difference (the deviation amount) between the reference left sensor position and the position 26*b* of the left sensor 23*b* is calculated. The position 26*b* of the left sensor 23*b* also reflects the position of the transferred wafer W. Thus, in the first embodiment, the deviation amount between the reference left sensor position and the position 26*b* of the left sensor 23*b* is considered as the deviation amount of the wafer W. Next, the average of the deviation amount of the position 26*a* detected by the right sensor 23*a* with respect to the reference right sensor position and the deviation amount of the position 26*b* detected by the left sensor 23*b* with respect to the reference left sensor position is obtained. The average deviation amount is acquired as the deviation amount of the wafer W that is used for controlling the operation speed of the transfer robot. The acquired deviation amount includes the deviation amount of the holding position from the reference position at the time when the fork 22 obtains the wafer W, and the slippage amount of the wafer W during transfer.

<Relationship Between Slippage Amount of Wafer W and Transfer Speed>

Figure 5:
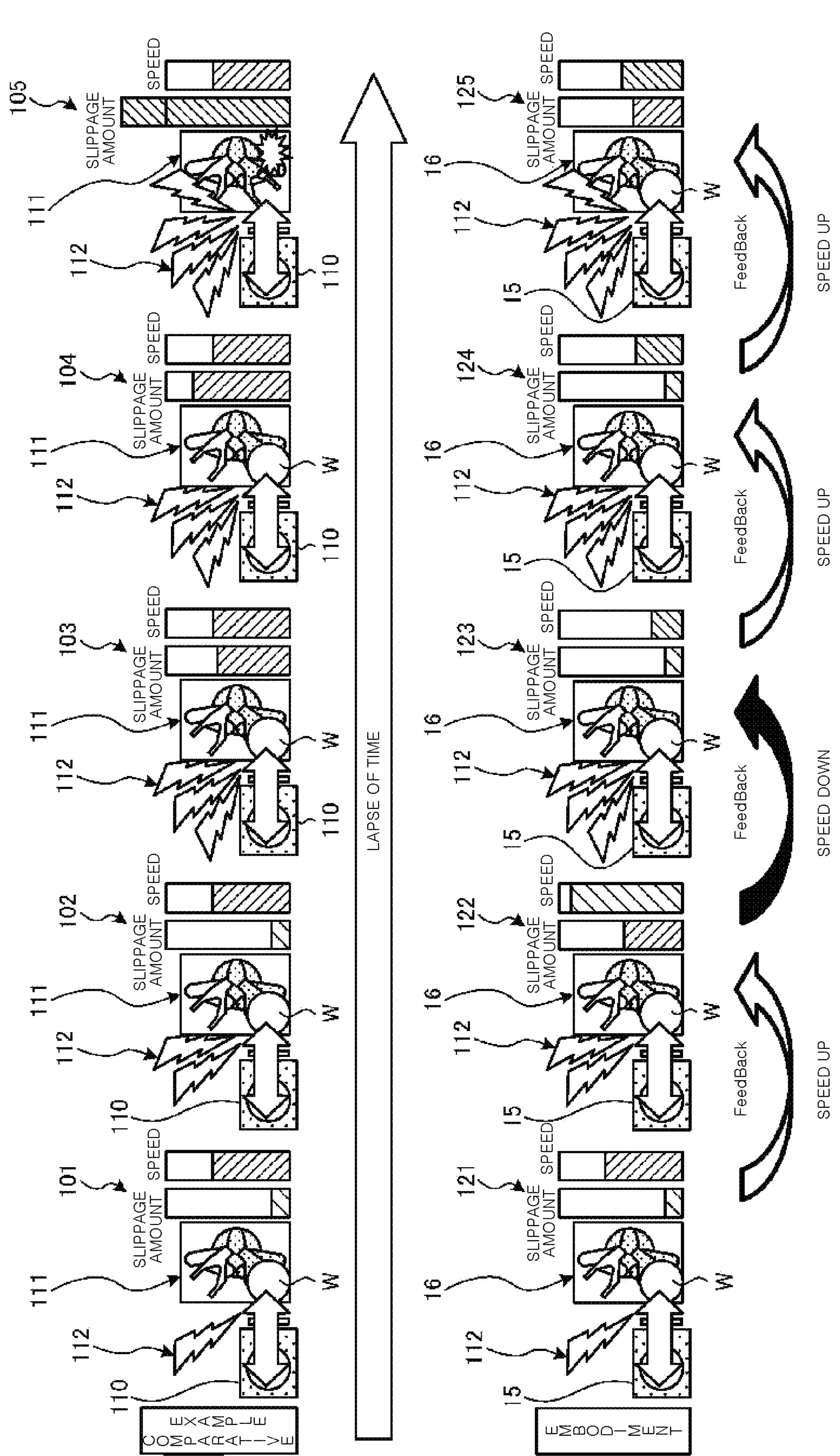
FIG. 5 explains an example of comparison of relationship between a slippage amount of a wafer and a transfer speed.

Next, the relationship between the slippage amount of the wafer W and the transfer speed will be described with reference to FIGS. 5 and 6. FIG. 5 explains an example of comparison of the relationship between the slippage amount of the wafer and the transfer speed. In FIG. 5, the case where the transfer speed is constant is described as a comparative example, and the case where the feedback of the transfer speed is performed using the slippage amount of the wafer W is described as an embodiment. In FIGS. 5 and 6, the case where the wafer W is loaded into and unloaded from the substrate processing chambers 110 and 15 by the transfer robots 111 and 16 will be described as an example of the case of transferring the wafer W.

First, in the comparative example, it is assumed that time elapses from a state 101 to a state 105. The state 101 indicates a state in which there are a small number of factors 112 for the slippage of the wafer W on the fork of the transfer robot 111 when the wafer W is loaded into and unloaded from the substrate processing chamber 110. The factors 112 include, for example, the state of the wafer W, such as a temperature of the wafer W, a film on the backside, flatness, or the like, or the state of the pad on the fork. In FIGS. 5 and 6, the number of figures indicating the factors 112 increases as the states included in the factors 112 cause the wafer W to be more likely to slip.

When the factors 112 gradually increase and the state becomes a state 103 through a state 102, the slippage amount increases but is still within an allowable range and, thus, the loading/unloading of the wafer W continues. When the state becomes the state 105 through a state 104, the slippage amount exceeds the allowable range in which the fork can hold the wafer W and, thus, the wafer W falls.

On the other hand, also in the embodiment, it is assumed that time elapses from a state 121 to a state 125. The state 121 indicates a state in which there are a small number of factors 112 for the slippage of the wafer W on the fork 22 of the transfer robot 16 when the wafer W is loaded into and unloaded from the substrate processing chamber 15. The factors 112 are the same as those of the comparative example.

In a state 122, the slippage amount is used to perform feedback on the transfer speed and the transfer speed is increased, because the slippage amount in a state 121 is within the increase-allowable range of the transfer speed. Next, in a state 123, the feedback is performed on the transfer speed and the transfer speed is decreased, because the slippage amount is out of the increase-allowable range of the transfer speed as time elapses. Even if the transfer speed is once decreased, the transfer speed may be increased again. In states 124 and 125, the transfer speed that has once decreased in the state 123 is gradually increased while performing the feedback of the transfer speed using the slippage amount.

FIG. 6 explains an example of comparison of the relationship between the slippage amount of the wafer and the transfer speed in the case of performing maintenance. FIG. 6 illustrates the changes in the transfer speed in the case of resetting the factors 112 for the slippage of the wafer W by performing the maintenance of the substrate processing apparatus 10. Further, in FIG. 6, it is assumed that time elapses from a state 141 to a state 145 in the embodiment and from a state 131 to a state 135 in the comparative example. Since, however, the time axis before and after the maintenance is expanded, it is described that there is no change in the factors 112 due to the elapse of time.

In the comparative example, the state 131 indicates a state immediately before the maintenance and a state in which the slippage amount of the wafer W has increased. Next, in the state 132, the maintenance of the substrate processing apparatus is performed, and the pad on the fork of the transfer robot 111 is replaced with new one. The state 133 indicates a state immediately after the maintenance. Even if the time elapses to the states 134 and 135, the slippage amount does not change and the transfer speed is constant.

Also in the embodiment, the state 141 indicates a state immediately before the maintenance and a state in which the transfer speed has decreased depending on the factors 112. Next, in the state 142, the maintenance of the substrate processing apparatus 10 is performed, and the pad on the fork 22 of the transfer robot 16 is replaced with new one. The state 143 indicates a state immediately after that maintenance and a state in which the slippage amount is small. Then, the feedback of the transfer speed is performed using the slippage amount, and the transfer speed is gradually increased in the states 144 and 145. In the embodiment shown in FIGS. 5 and 6, the transfer speed can be adjusted depending on the factors 112, so that the operation speed of the transfer robot 16 can be optimized.

<Center of Gravity of Wafer W and Increase-Allowable Range of Transfer Speed>

Next, the relationship between the center of gravity of the wafer W and the increase-allowable range of the transfer speed will be described with reference to FIGS. 7 to 9. FIG. 7 shows an example of the increase-allowable range of the transfer speed of the first embodiment. As shown in FIG. 7, an increase-allowable range 150 is set, for example, in a circular shape around a center-of-gravity position 151 of the wafer W before transfer. In the following description, it is assumed that there is no deviation of the wafer W from the fork 22. In other words, the center-of-gravity position 151 of the wafer W before transfer coincides with the center-of-gravity position corresponding to the reference position at the time of holding the wafer W by the fork 22. Further, the increase-allowable range 150 is illustrated in a larger size than the actual size for explanation.

The wafer W held by the fork 22 slips on the fork 22 when it is transferred. The center-of-gravity position after transfer is moved to a center-of-gravity position 152, for example. In this case, the slippage amount of the wafer W is referred to as "slippage amount 153." Since the center-of-gravity position 152 is within the increase-allowable range 150, the transfer robot 16 is controlled to increase the transfer speed.

FIGS. 8A to 8C show an example of the center-of-gravity position of the wafer in the increase-allowable range of the transfer speed. FIG. 8A shows the case where the center-of-gravity position 152 is out of the increase-allowable range 150. In this case, the transfer robot 16 is controlled to reduce the transfer speed. FIGS. 8B and 8C show the case where the center-of-gravity position 152 slips in a direction opposite to that in FIG. 8A but is within the increase-allowable range 150. In this case, the transfer robot 16 is controlled to increase the transfer speed. When the increase-allowable range 150 is set in a circular shape, the transfer speed is controlled by the same slippage amount regardless of the slippage direction of the wafer W. Further, the increase-allowable range 150 does not necessarily have a circular shape, and may have an elliptical shape or a rectangular shape elongated in the transfer direction in which the acceleration is large, as long as the transfer position can be corrected by the transfer robot 16.

Figure 9:
FIG. 9 shows an example of relationship between a speed coefficient and an acceleration in each operation.

FIG. 9 shows an example of the relationship between the speed coefficient and the acceleration in each operation. In FIG. 9, examples of set values of the acceleration applied to the wafer W in the Get operation, the Put operation, and the Move operation of the transfer robot 16, and the acceleration at the time of increasing the transfer speed will be described. Here, the Get operation is an operation in which the fork 22 obtains the wafer W from the placing table in a substrate placement chamber to the standby position of the substrate transfer chamber 14 corresponding to the substrate placement chamber. The Put operation is an operation in which the wafer W is placed on the placing table in the substrate placement chamber from the standby position of the substrate transfer chamber 14 corresponding to the substrate placement chamber. The Move operation is an operation in which the wafer W is transferred from the standby position of the substrate transfer chamber 14 corresponding to a certain substrate placement chamber to the standby position of the substrate transfer chamber 14 corresponding to another substrate placement chamber. The substrate placement chamber includes the load-lock chambers 13, the substrate processing chambers and a transfer module (path) for transferring the wafer W between multiple substrate transfer chambers 14.

Table 160 of FIG. 9 shows the acceleration of each operation in the case where the speed coefficient is 100%, X %, A %, B %, and C %. The column where the speed coefficient is 100% indicates the maximum value of the acceleration in each operation, that is, the acceleration obtained when the transfer speed is maximum. The speed can be accelerated up to 0.70 G in the Get operation, 0.71 G in the Put operation, and 0.66 G in the Move operation. G indicates the unit of gravitational acceleration.

The column where the speed coefficient is X % indicates the set values at the time of increasing the transfer speed. The columns where the speed coefficients are A %, B %, and C % indicate the initial values of the Get operation, the Put operation, and the Move operation, respectively. In the column where the speed coefficient is A %, 0.4 G is set as the set value of the acceleration in the Get operation. In this case, a set value Ap of the Put operation and a set value Am of the Move operation are uniquely determined by 0.4 G that is the set value of the Get operation.

In the column where the speed coefficient is B %, 0.4 G is set as the set value of the acceleration in the Put operation. In this case, a set value Bg of the Get operation and a set value Bm of the Move operation are uniquely determined by 0.4 G that is the set value of the Put operation. In the column where the speed coefficient is Co. 0.4 G is set as the set value of the acceleration in the Move operation. In this case, a set value Cg of the Get operation and a set value Cp of the Put operation are uniquely determined by 0.4 G that is the set value of the Move operation.

In the column where the speed coefficient is X %, 0.41 G, which is increased from the initial value of 0.4 G by 0.01 G, is set as the set value of the acceleration in the Move operation, for example. In this case, a set value Xg of the Get operation and a set value Xp of the Put operation are uniquely determined by 0.41 G that is the set value of the Move operation. The holding force of the wafer W is the force that can withstand the acceleration applied to the wafer W at the time of transferring the wafer W. In other words, when the holding force decreases due to deterioration over time, the wafer W is likely to slip even with the same acceleration, and the slippage amount increases. In other words, due to the deterioration over time, the slippage may occur over time, or the occurrence of slippage may be stopped or repeated over time.

<Transfer Method>

Figure 10:
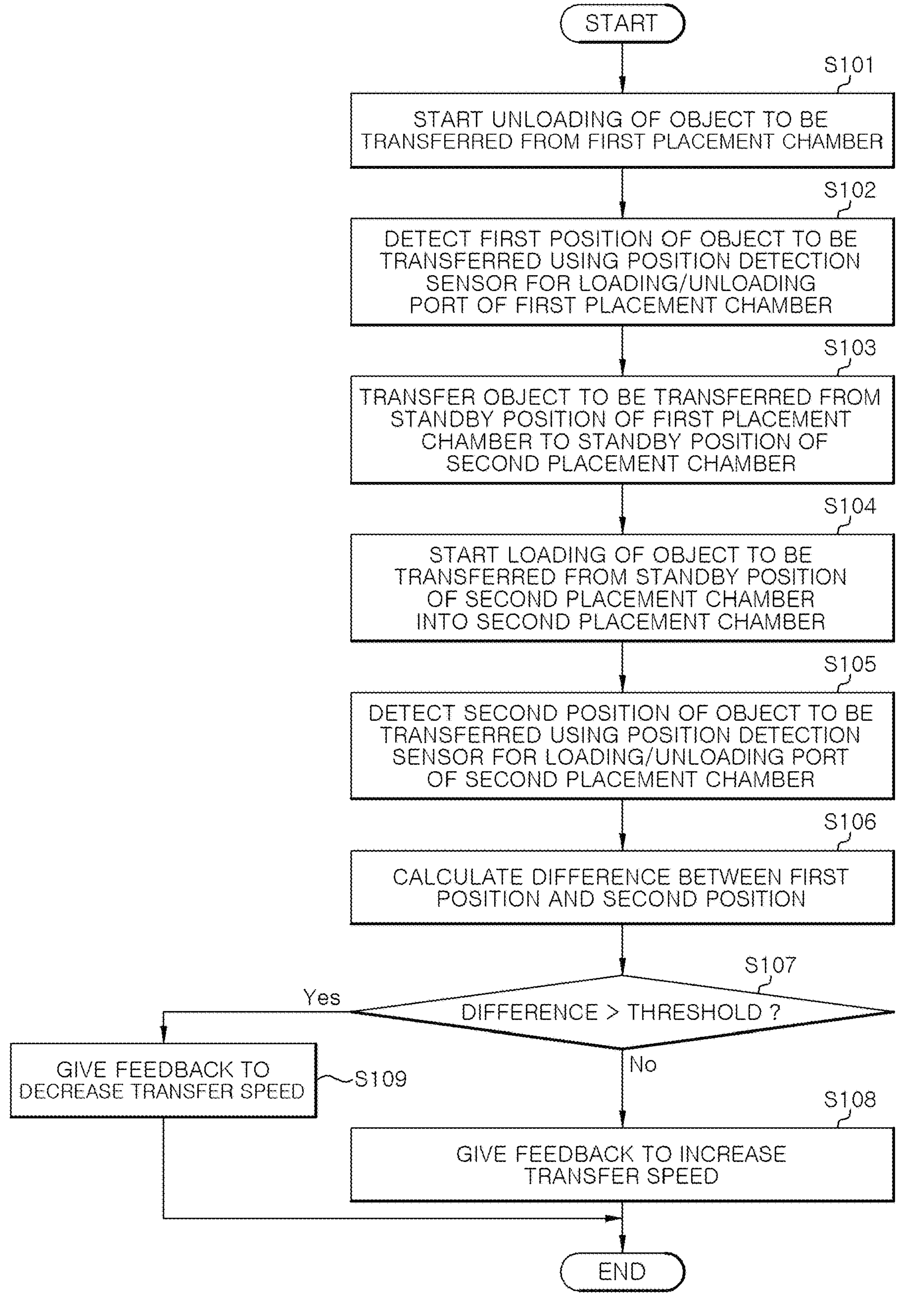
FIG. 10 is a flowchart showing an example of a speed control process of a transfer method in the first embodiment.

Next, a transfer method in the first embodiment will be described. FIG. 10 is a flowchart showing an example of a speed control process of the transfer method in the first embodiment. The process of FIG. 10 can also be applied to the case of transferring an object to be transferred other than the wafer W. Therefore, the first substrate placement chamber and the second substrate placement chamber are described as the first placement chamber and the second substrate placement chamber, respectively, and the wafer W is described as an object to be transferred. Although the control for the transfer robot 16 in the substrate transfer chamber 14 is described as an example of the speed control process of FIG. 10, the speed control process can also be applied to the control for the transfer robot in the loader chamber 12.

The controller 17 starts unloading of the object to be transferred from the first placement chamber to the standby position of the first placement chamber in the substrate transfer chamber 14 (step S101). The controller 17 detects the holding position of the object to be transferred using the sensor pair 23 that are position detection sensors for the loading/unloading port of the first placement chamber at the time of unloading the object to be transferred. The controller 17 detects, as a first position, the deviation amount of the center-of-gravity position of the object to be transferred based on the detected holding position and the reference position at the time of holding the object to be transferred (step S102).

After the object to be transferred is unloaded to the standby position of the first placement chamber, the controller 17 transfers the object to be processed from the standby position of the first placement chamber to the standby position of the second placement chamber in the substrate transfer chamber 14 (step S103).

The controller 17 starts loading of the object to be transferred from the standby position of the second placement chamber into the second placement chamber (step S104). The controller 17 detects the holding position of the object to be transferred using the sensor pair 23 that are position detection sensors for the loading/unloading port of the second placement chamber at the time of loading the object to be transferred. The controller 17 detects, as a second position, the deviation amount of the center-of-gravity position of the object to be processed based on the detected holding position and the reference position of the fork 22 at the time of holding the object to be transferred (step S105).

The controller 17 calculates the difference between the first position and the second position (step S106). In other words, the controller 17 calculates the movement amount (slippage amount) of the object to be transferred during transfer. The controller 17 determines whether or not the calculated difference exceeds a threshold (step S107). The threshold may be, for example, a value that is 1.5 times the radius of the increase-allowable range 150. Further, the threshold may be a threshold for detecting a certain level of slippage, or may be any value such as the radius of the increase-allowable range 150 or a value that is 0.8 times the radius. When it is determined that the difference is smaller than or equal to the threshold (step S107: No), the controller 17 gives feedback to the transfer robot 16 to increase the transfer speed (step S108), and terminates the processing.

On the other hand, when it is determined that the difference exceeds the threshold (step S107: Yes), the controller 17 gives feedback to the transfer robot 16 to decrease the transfer speed (step S109), and terminates the processing. In this manner, the operation speed of the transfer robot 16 can be optimized depending on the slippage amount of the object to be transferred. Since the transfer speed is optimized, the throughput of the processing in the substrate processing apparatus 10 can be improved. Further, since the speed coefficient of the transfer speed can be determined by the feedback control, the man-hours for setting the speed coefficient of the transfer robot 16 can be reduced.

<Measurement of Deviation Amount>

Figure 11:
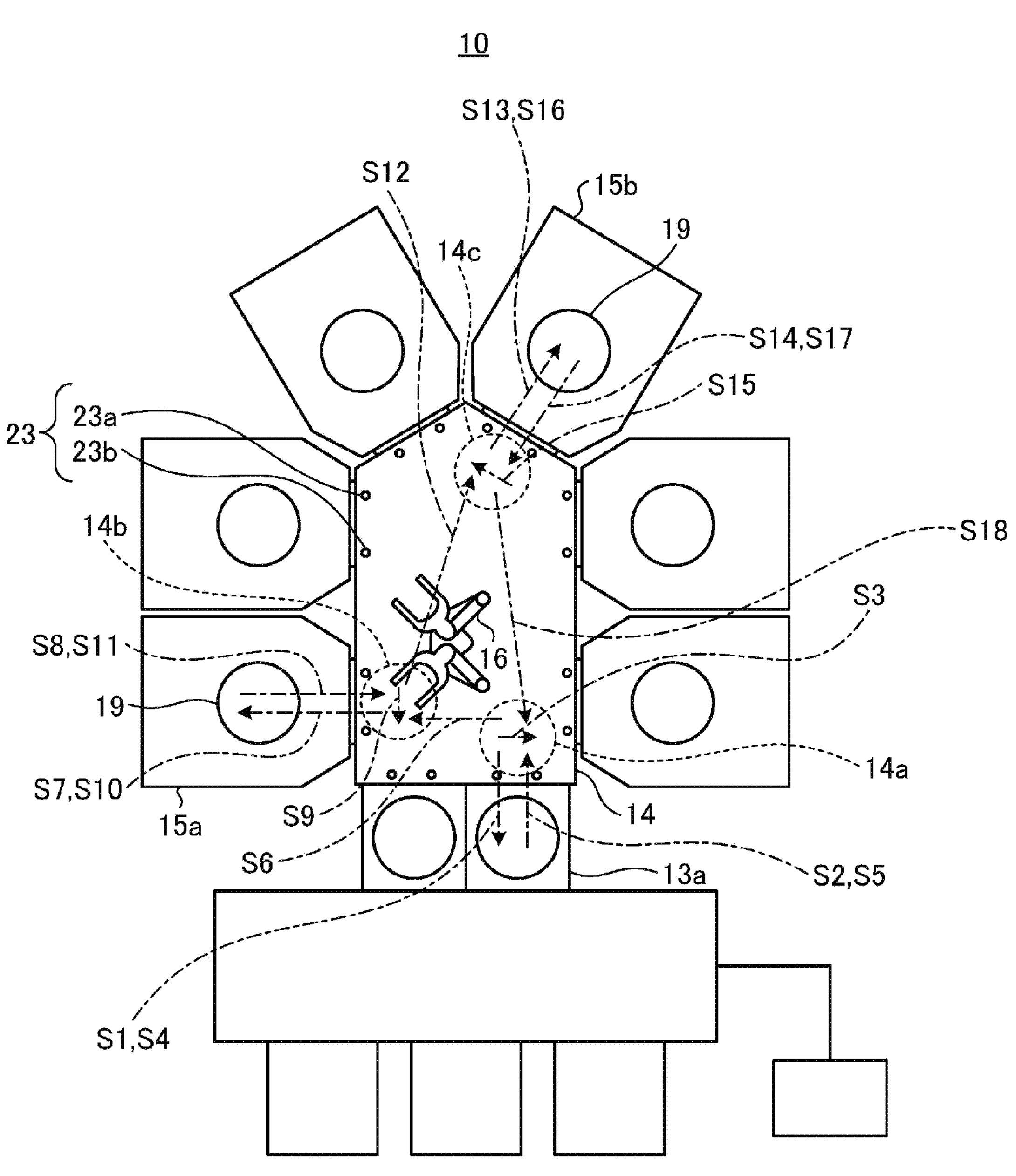
FIG. 11 shows an example of a transfer path in the first embodiment.

Next, the measurement of the deviation amount (including the slippage amount) in the transfer path of the wafer W will be described with reference to FIGS. 11 to 14. FIG. 11 shows an example of a transfer path in the first embodiment. Steps S1 to S18 of FIG. 11 indicate the transfer path from the load-lock chamber (LLM) 13*a* to the substrate processing chamber (PM) 15*a*, from the substrate processing chamber (PM) 15*a* to the substrate processing chamber (PM) 15*b*, and from the substrate processing chamber (PM) 15*b* to the load-lock chamber (LLM) 13*a*.

Figure 12:
FIG. 12 shows an example of an acceleration in each Move operation.

FIG. 12 shows an example of an acceleration in each Move operation. FIG. 13 shows an example of measurement of the deviation amount of the transfer path in the first embodiment. In Table 161 of FIG. 12, the step numbers of the Get operation, the Move operation, and the Put operation are correlated with the initial values of the acceleration in the Move operation in each transfer path. Table 162 of FIG. 13 shows the operation of the fork 22 of the transfer robot 16, the acceleration of the wafer W, and the detected deviation amount in the X-axis and the Y-axis from the reference positions of forks 22L and 22R in steps S1 to S18. The transfer robot 16 has two articulated arms 21 each having a fork 22. In FIG. 11, the fork on the load-lock chamber 13*a* side (left transfer robot 16) is set to the fork 22L, and the fork distant from the load-lock chamber 13*a* (left transfer robot

16) is set to the fork 22R. Since four wafers W are transferred, they are distinguished as wafers W1 to W4.

First, the transfer robot 16 moves the fork 22L from the standby position 14*a* of the load-lock chamber 13*a* in the substrate transfer chamber 14 to the load-lock chamber 13*a* (step S1). At this time, the fork 22L is empty, and the fork 22R holds the wafer W1 that has been processed in the substrate processing chamber 15*b*. In Table 162, in the column of the deviation amount, the state in which the wafers W1 to W4 are held or the empty state are illustrated. The transfer robot 16 uses the fork 22L to obtain the wafer W2 from the load-lock chamber 13*a* by the Get operation (step S2). At this time, the deviation amount of the obtained wafer W2 from the reference position of the fork 22L is measured by the sensor pair 23 near the standby position 14*a*. It is assumed that the X-axis deviation amount is 0.051 mm, and the Y-axis deviation amount is 0.033 mm, for example.

The transfer robot 16 replaces the fork 22L located at the standby position 14*a* with the fork 22R by the Change operation (step S3). The transfer robot 16 places the processed wafer W1 held by the fork 22R in the load-lock chamber 13*a* by the Put operation (step S4). At this time, the deviation amount of the processed wafer W1 from the reference position of the fork 22R is measured by the sensor pair 23 near the standby position 14*a*. It is assumed that the X-axis deviation amount is 0.034 mm, and the Y-axis deviation amount is 0.059 mm, for example. Since the fork 22R holds the wafer W1 that has been processed in the substrate processing chamber 15*b*, the accelerations of the wafers W1 and W2 in steps S1 to S4 are set to 0.3 G to correspond to the Move operation from the substrate processing chamber 15*b* to the load-lock chamber 13*a*. In other words, it is set to one in which the acceleration limit is lower between the two forks 22L and 22R. Further, the controller 17 gives feedback of the transfer speed in the transfer path from the standby position 14*c* to the standby position 14*a* based on the result of the deviation amount measured in step S4.

After the transfer robot 16 moves the fork 22R to the standby position 14*a* (step S5), the transfer robot 16 transfers the wafer W2 held by the fork 22L to the vicinity of the standby position 14*b* of the substrate processing chamber 15*a* by the Move operation (step S6). In other words, the transfer robot 16 moves the empty fork 22R to the standby position 14*b*. At this time, the wafer W2 is transferred while increasing the acceleration from 0.48 G to 0.49 G. In other words, in the corresponding transfer path, the transfer speed is increased by performing feedback. In other words, it is tested whether or not slippage occurs in the transfer path by increasing the transfer speed. If there is no slippage, the feedback is given to increase the transfer speed. On the other hand, when slippage occurs, the feedback is given to decrease the transfer speed. During the test, in another transfer path, the transfer is performed at a transfer speed at which slippage does not occur. The above test is performed by selecting any one of the multiple transfer paths. In Table 162, upward arrows indicate that the acceleration is increased from the initial value.

When the fork 22R moves to the standby position 14*b*, the transfer robot 16 moves the fork 22R to the placing table 19 of the substrate processing chamber 15*a* (step S7). Since the fork 22L holds the wafer W2 obtained from the load-lock chamber 13*a*, the acceleration of the wafer W2 in steps S5 and S7 is set to 0.48 G to correspond to the Move operation from the load-lock chamber 13*a* to the substrate processing chamber 15*a*.

The transfer robot 16 uses the fork 22R to obtain the processed wafer W3 from the placing table 19 of the substrate processing chamber 15*a* by the Get operation (step S8). At this time, the deviation amount of the obtained wafer W3 from the reference position of the fork 22R is measured by the sensor pair 23 near the standby position 14*b*. It is assumed that the X-axis deviation amount is 0.066 mm, and the Y-axis deviation amount is 0.078 mm, for example.

The transfer robot 16 replaces the fork 22R located at the standby position 14*b* with the fork 22L by the Change operation (step S9). The transfer robot 16 places the wafer W2 held by the fork 22L on the placing table 19 of the substrate processing chamber 15*a* by the Put operation (step S10). At this time, the deviation amount of the wafer W2 from the reference position of the fork 22L is measured by sensor pair 23 near the standby position 14*b*. It is assumed that the X-axis deviation amount is 0.051 mm, and the Y-axis deviation amount is 0.033 mm, for example. Further, since the deviation amount measured in step S10 is the same as the deviation amount measured in step S2, the controller 17 gives feedback to increase the transfer speed in the transfer path from the standby position 14*a* to the standby position 14*b*.

After the transfer robot 16 moves the fork 22L to the standby position 14*b* (step S11), the transfer robot 16 transfers the wafer W3 held by the fork 22R to the vicinity of the standby position 14*c* of the substrate processing chamber 15*b* by the Move operation (step S12). In other words, the transfer robot 16 moves the empty fork 22L to the standby position 14*c*. At this time, it is assumed that the acceleration of the wafer W3 is increased from 0.38 G to 0.39 G. In other words, it is assumed that the feedback is performed to increase the transfer speed in the transfer path.

When the fork 22L moves to the standby position 14*c*, the transfer robot 16 moves the fork 22L to the placing table 19 of the substrate processing chamber 15*b* (step S13). Since the fork 22R holds the wafer W3 processed in the substrate processing chamber 15*a*, the acceleration of the wafer W3 in steps S8 to S11 and S13 is adjusted to 0.38 G to correspond to the Move operation from the substrate processing chamber 15*a* to the substrate processing chamber 15*b*.

The transfer robot 16 uses the fork 22L to obtain the processed wafer W4 from the placing table 19 of the substrate processing chamber 15*b* by the Get operation (step S14). At this time, the deviation amount of the obtained wafer W4 from the reference position of the fork 22L is measured by the sensor pair 23 near the standby position 14*c*. It is assumed that the X-axis deviation amount is 0.072 mm and the Y-axis deviation amount is 0.053 mm, for example.

The transfer robot 16 replaces the fork 22L located at the standby position 14*c* with the fork 22R by the Change operation (step S15). The transfer robot 16 places the wafer W3 held by the fork 22R on the placing table 19 of the substrate processing chamber 15*b* by the Put operation (step S16). At this time, the sensor pair 23 near the standby position 14*c* measures the deviation amount of the wafer W3 from the reference position of the fork 22R. It is assumed that the X-axis deviation amount is 0.054 mm and the Y-axis deviation amount is 0.085 mm, for example. Since the deviation amount measured in step S16 is not the same as the deviation amount measured in step S8, the controller 17 gives feedback to decrease the transfer speed in the transfer path from the standby position 14*b* to the standby position 14*c*.

After the transfer robot 16 moves the fork 22R to the standby position 14*c* (step S17), the transfer robot 16 transfers the wafer W4 held by the fork 22L to the vicinity of the standby position 14*a* of the load-lock chamber 13*a* by the Move operation (step S18). In other words, the transfer robot 16 moves the empty fork 22R to the standby position 14*a*. At this time, it is assumed that the acceleration of wafer W4 is increased from 0.31 G to 0.32 G. In other words, it is assumed that the feedback is performed to increase the transfer speed in the transfer path. When step S18 is completed, the processing returns to step S1 in a state where the fork 22L and the fork 22R are replaced. In this manner, in the first embodiment, the deviation amount of each transfer path of the wafer W is measured based on the measurement results of two of the sensor pairs 23 near the load-lock chambers 13*a* and the substrate processing chambers 15*a* and that are examples of the substrate placement chamber.

Next, the feedback of the transfer speed in a specific transfer path will be described with reference to FIG. 14. FIG. 14 shows an example of a speed control process in a specific transfer path of the first embodiment. Table 163 of FIG. 14 shows the operation of the fork 22 of the transfer robot 16, the acceleration of the wafer W, and the detected deviation amount in the X-axis and the Y-axis from the reference position of the fork 22 in steps S21 to S32. In FIG. 14, the forks 22L and 22R and the wafers W1 to W4 are not distinguished and are described as the fork 22 and the wafer W. In FIG. 14, it is assumed that the wafer W is transferred from the first substrate placement chamber to the second substrate placement chamber, and the threshold for detecting slippage of the wafer W is 0.003 mm.

The transfer robot 16 uses the fork 22 to obtain the wafer W from the first substrate placement chamber by the Get operation (step S21). At this time, it is assumed that the X-axis deviation amount measured for the obtained wafer W is 0.051 mm and the Y-axis deviation amount measured for the obtained wafer W is 0.033 mm, for example.

The transfer robot 16 transfers the wafer W held by the fork 22 to the standby position of the second substrate placement chamber by the Move operation (step S22). At this time, it is assumed that the acceleration of the wafer W is increased from 0.4 G to 0.41 G. In other words, it is assumed that the feedback is performed to increase the transfer speed in the transfer path.

The transfer robot 16 places the wafer W held by the fork 22 on the placing table of the second substrate placement chamber by the Put operation (step S23). At this time, it is assumed that the X-axis deviation amount measured for the wafer W is 0.051 mm the Y-axis deviation amount measured for the wafer W is 0.033 mm, for example. Since the difference (slippage amount) between the deviation amount measured in step S21 and the deviation amount measured in step S23 is 0 mm and is smaller than or equal to the threshold, the controller 17 gives feedback to increase the transfer speed in the transfer path from the standby position of the first substrate placement chamber to the standby position of the second substrate placement chamber (step S24).

Next, the transfer robot 16 uses the fork 22 to obtain the wafer W from the first substrate placement chamber by the Get operation (step S25). At this time, it is assumed that the X-axis deviation amount measured for the obtained wafer W is 0.066 mm and the Y-axis deviation amount measured for the obtained wafer W is 0.078 mm, for example.

The transfer robot 16 transfers the wafer W held by the fork 22 to the standby position of the second substrate placement chamber by the Move operation (step S26). At this time, the acceleration of the wafer W is increased from 0.41 G to 0.42 G.

The transfer robot 16 places the wafer W held by the fork 22 on the placing table of the second substrate placement chamber by the Put operation (step S27). At this time, it is assumed that the X-axis deviation amount measured for the wafer W is 0.082 mm and the Y-axis deviation amount measured for the wafer W is 0.091 mm, for example. Since the difference (slippage amount) between the deviation amount measured in step S25 and the deviation amount measured in step S27 is mm on the X-axis and 0.013 mm on the Y-axis and exceeds the threshold, the controller 17 gives feedback to decrease the transfer speed in the transfer path from the standby position of the first substrate placement chamber to the standby position of the second substrate placement chamber (step S28).

Next, the transfer robot 16 uses the fork 22 to obtain the wafer W from the first substrate placement chamber by the Get operation (step S29). At this time, it is assumed that the X-axis deviation measured for the obtained wafer W is mm and the Y-axis deviation amount measured for the obtained wafer W is 0.067 mm, for example.

The transfer robot 16 transfers the wafer W held by the fork 22 to the standby position of the second substrate placement chamber by the Move operation (step S30). At this time, the difference in the deviation amount (slippage amount) in the previous transfer path exceeds the threshold, so that the feedback is given to decrease the acceleration of the wafer W from 0.42 G to 0.41 G.

The transfer robot 16 places the wafer W held by the fork 22 on the placing table of the second substrate placement chamber by the Put operation (step S31). At this time, it is assumed that the X-axis deviation amount measured for the wafer W is, 0.040 mm and the Y-axis deviation amount measured for the wafer W is 0.067 mm, for example. Since the difference (slippage) between the deviation amount measured in step S29 and the deviation amount measured in step S31 is 0.004 mm on the X-axis and 0 mm on the Y-axis and exceeds the threshold, the controller 17 gives feedback to decrease the transfer speed in the transfer path from the standby position of the first substrate placement chamber to the standby position of the second substrate placement chamber (step S32). In this manner, in the first embodiment, the feedback of the transfer speed in a specific transfer path is performed based on the slippage amount measured in the corresponding transfer path. In other words, the operation speed of the transfer robot 16 can be optimized for each transfer path depending on the slippage amount of the wafer W.

Second Embodiment

In the above-described first embodiment, the substrate processing apparatus 10 capable of measuring the deviation amount of the wafer W in one transfer path twice was used. However, the present disclosure can be applied to a substrate processing apparatus capable of measuring the deviation amount of the wafer W in one transfer path once. Such an embodiment will be described as a second embodiment. Like reference numerals will be used for like parts as those of the substrate processing apparatus 10 of the first embodiment, and the description of redundant components and operations will be omitted.

Figure 15:
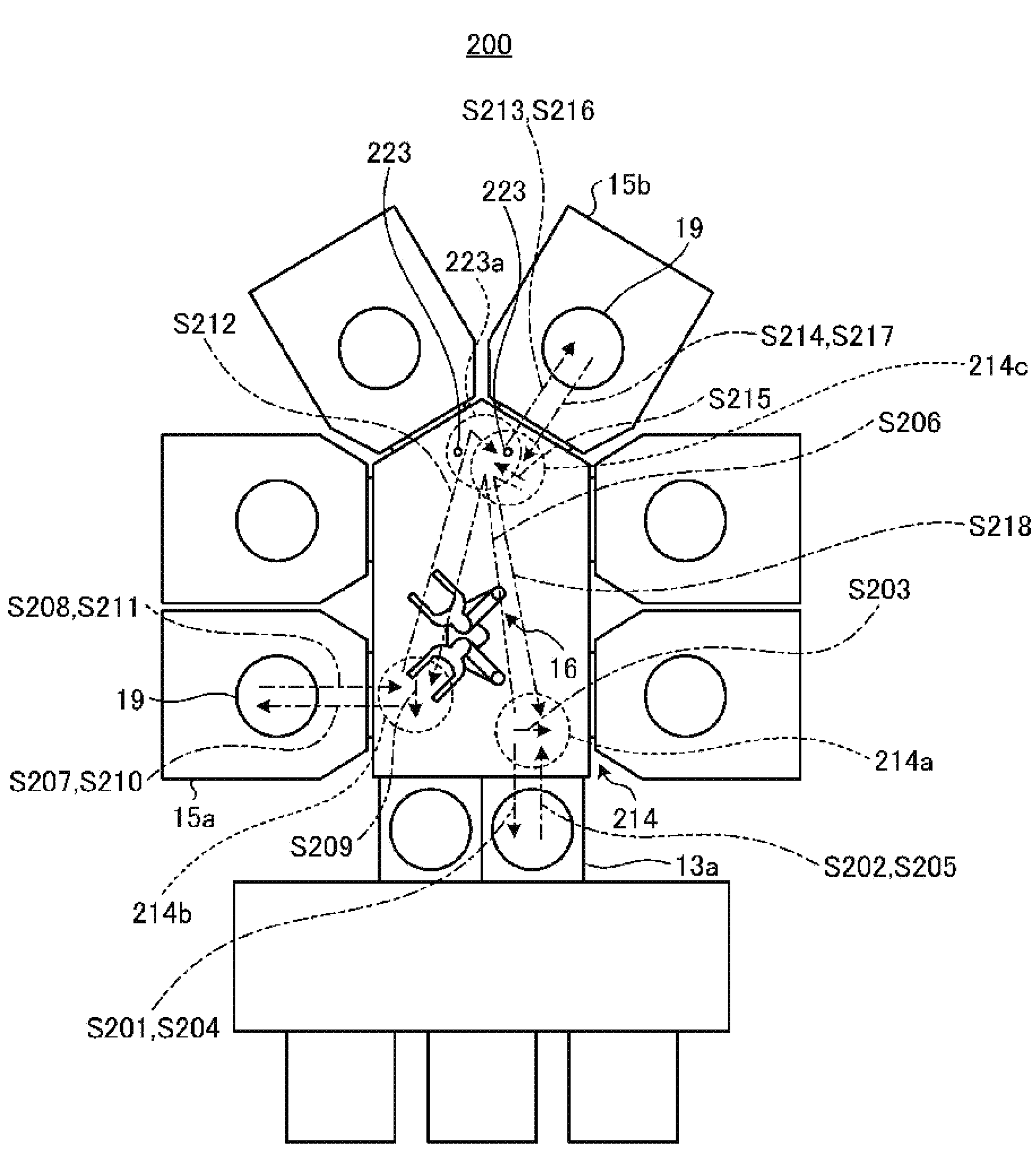
FIG. 15 shows an example of a transfer path in a second embodiment.

FIG. 15 shows an example of a transfer path in the second embodiment. A substrate processing apparatus 200 shown in FIG. 15 includes a substrate transfer chamber 214, instead of the substrate transfer chamber 14 of the first embodiment. The substrate transfer chamber 214 has position detection sensors 223, instead of the sensor pair 23 of the first embodiment. Two position detection sensors 223 are arranged at measurement positions 223*a* in the substrate transfer chamber 214 that are distant from each substrate processing chamber 15. The position detection sensors 223 measure the deviation amount of the wafer W transferred from the reference position to the measurement position 223*a*.

Steps S201 to S218 of FIG. 15 indicate the transfer path from the load-lock chamber (LLM) 13*a* to the substrate processing chamber (PM) 15*a*, from the substrate processing chamber (PM) 15*a* to the substrate processing chamber (PM) 15*b*, and from the substrate processing chamber (PM) 15*b* to the load-lock chamber (LLM) 13*a*.

FIG. 16 shows an example of measurement of the deviation amount of the transfer path in the second embodiment. Table 164 in FIG. 16 shows the operation of the fork 22 of the transfer robot 16, the acceleration of the wafer W, and the detected X-axis deviation amount and the detected Y-axis deviation amount from the reference positions of the fork 22L and 22R in steps S201 to S218. Similarly to the first embodiment, in FIG. 15, in the transfer robot 16, the fork of the transfer robot 16 on the load-lock chamber 13*a* side (the left transfer robot 16) is set to the fork 22L, and the fork of the transfer robot 16 distant from the load-lock chamber 13*a* (the right transfer robot 16) is set to the fork 22R. Since four wafers W are transferred, they are distinguished as the wafers W1 to W4.

First, the transfer robot 16 moves the fork 22L from the standby position 214*a* of the load-lock chamber 13*a* in the substrate transfer chamber 214 to the load-lock chamber 13*a* (step S201). At this time, the fork 22L is empty, and the fork 22R holds the wafer W1 that has been processed in the substrate processing chamber 15*b*. In Table 164, in the column of the deviation amount, the state in which the wafers W1 to W4 are held or the empty state are illustrated. The transfer robot 16 uses the fork 22L to obtain the wafer W2 from the load-lock chamber 13*a* by the Get operation (step S202).

The transfer robot 16 replaces the fork 22L located at the standby position 214*a* with the fork 22R by the Change operation (step S203). The transfer robot 16 places the processed wafer W1 held by the fork 22R in the load-lock chamber 13*a* by the Put operation (step S204). Since the fork 22R holds the wafer W1 that has been processed in the substrate processing chamber 15*b*, the acceleration of the wafers W1 and W2 in steps S201 to S204 is set to 0.3 G to correspond to the Move operation from the substrate processing chamber 15*b* to the load-lock chamber 13*a*.

After the transfer robot 16 moves the fork 22R to the standby position 214*a* (step S205), the transfer robot 16 transfers the wafer W2 held by the fork 22L to the vicinity of the standby position 214*b* of the substrate processing chamber 15*a* via the measurement position 223*a* by the Move operation (step S206). In other words, the transfer robot 16 moves the empty fork 22R to the standby position 214*b*. At the measurement position 223*a*, the position detection sensor 223 measures the deviation amount of the transferred wafer W2 from the reference position. It is assumed that the X-axis deviation amount is 0.051 mm, and the Y-axis deviation amount is 0.033 mm, for example. It is assumed that the acceleration of wafer W2 is increased from 0.48 G to 0.49 G during the transfer in step S206. In Table 164, upward arrows indicates that the acceleration is increased from the initial value. In other words, it is assumed that the feedback is performed to increase the transfer speed in the transfer path.

When the fork 22R moves to the standby position 214*b*, the transfer robot 16 moves the fork 22R to the placing table 19 of the substrate processing chamber 15*a* (step S207). Since the fork 22L holds the wafer W2 obtained from the load-lock chamber 13*a*, the acceleration of the wafer W2 in steps S205 and S207 is set to 0.48 G to correspond to the Move operation from the load-lock chamber 13*a* to the substrate processing chamber 15*a*.

The transfer robot 16 uses the fork 22R to obtain the processed wafer W3 from the placing table 19 of the substrate processing chamber 15*a* by the Get operation (step S208). The transfer robot 16 replaces the fork 22R located at the standby position 214*b* with the fork 22L by the Change operation (step S209). The transfer robot 16 places the wafer W2 held by the fork 22L on the placing table 19 of the substrate processing chamber 15*a* by the Put operation (step S210).

After the transfer robot 16 moves the fork 22L to the standby position 214*b* (step S211), the transfer robot 16 transfers the wafer W3 held by the fork 22R to the vicinity of the standby position 214*c* of the substrate processing chamber 15*b* via the measurement position 223*a* by the Move operation (step S212). In other words, the transfer robot 16 moves the empty fork 22L to the standby position 214*c*. At the measurement position 223*a*, the position detection sensor 223 measures the deviation amount of the transferred wafer W3 from the reference position. It is assumed that the X-axis deviation amount is 0.066 mm, and the Y-axis deviation amount is 0.078 mm, for example. It is assumed that the acceleration of wafer W3 is increased from 0.38 G to 0.39 G during the transfer in step S212. In other words, it is assumed that the feedback is performed to increase the transfer speed in the transfer path.

When the fork 22L moves to the standby position 214*c*, the transfer robot 16 moves the fork 22L to the placing table 19 of the substrate processing chamber 15*b* (step S213). Since the fork 22R holds the wafer W3 processed in the substrate processing chamber 15*a*, the acceleration of the wafer W3 in steps S208 to S211 and S213 is set to 0.38 G to correspond to the Move operation from the substrate processing chamber 15*a* to the substrate processing chamber 15.

The transfer robot 16 uses the fork 22L to obtain the processed wafer W4 from the placing table 19 of the substrate processing chamber 15*b* by the Get operation (step S214). The transfer robot 16 replaces the fork 22L located at the standby position 214*c* with the fork 22R by the Change operation (step S215). The transfer robot 16 places the wafer W3 held by the fork 22R on the placing table 19 of the substrate processing chamber 15*b* by the Put operation (step S216).

After the transfer robot 16 moves the fork 22R to the standby position 214*c* (step S217), the transfer robot 16 transfers the wafer W4 held by the fork 22L to the vicinity of the standby position 214*a* of the load-lock chamber 13*a* via the measurement position 223*a* by the Move operation (step S218). In other words, the transfer robot 16 moves the vacant fork 22R to the standby position 214*a*. At the measurement position 223*a*, the position detection sensor 223 measures the deviation amount of the wafer W4 transferred from the reference position. It is assumed that the X-axis deviation amount is 0.072 mm and the Y-axis deviation amount is 0.053 mm, for example. It is assumed that the acceleration of wafer W4 is increased from 0.31 G to 0.32 G during the transfer in step S218. In other words, it is assumed that the feedback is performed to increase the transfer speed in the transfer path. When step S218 is completed, the processing returns to step S201 in a state where the fork 22L and the fork 22R are replaced. In this manner, in the second embodiment, the deviation amount of each transfer path of the wafer W is measured based on the measurement result of the position detection sensor 223 at the measurement position 223*a*.

Next, the feedback of the transfer speed in a specific transfer path will be described with reference to FIG. 17. FIG. 17 shows an example of a speed control process in a specific transfer path of the second embodiment. Table 165 of FIG. 17 shows the operation of the fork 22 of the transfer robot 16, the acceleration of the wafer W, and the measured deviation amount in the X-axis and the Y-axis from the reference position of the fork 22 in steps S221 to S223. Table 165 also shows that statistical processing and transfer speed control are performed based on the measured deviation amounts in steps S224 to S226. In FIG. 17, the forks 22L and 22R and the wafers W1 to W4 are not distinguished, and are described as the fork 22 and the wafer W, respectively. Further, in FIG. 17, the transfer from the first substrate placement chamber to the second substrate placement chamber will be described.

The transfer robot 16 uses the fork 22 to obtain the wafer W from the first substrate placement chamber by the Get operation (step S221). The transfer robot 16 transfers the wafer W held by the fork 22 to the standby position of the second substrate placement chamber via the measurement position 223*a* by the Move operation (step S222). At the measurement position 223*a*, the position detection sensor 223 measures the deviation amount of the transferred wafer W from the reference position. It is assumed that the X-axis deviation amount is 0.051 mm, and the Y-axis deviation amount is 0.033 mm, for example. It is assumed that the acceleration of the wafer W is increased from 0.4 G to 0.41 G during the transfer in step S222. In other words, it is assumed that the feedback is performed to increase the transfer speed in the transfer path.

The transfer robot 16 places the wafer W held by the fork 22 on the placing table of the second substrate placement chamber by the Put operation (step S223). The transfer robot 16 repeats steps S221 to S223 multiple times (for example, 50 times), and the controller 17 acquires vertex data in the normal distribution of the deviation amount (step S224). The transfer robot 16 and the controller 17 repeat step S224 multiple times, and the controller 17 monitors the transition of the vertex data of the deviation amount (step S225). In other words, the controller 17 determines whether the deviation amount tends to remain unchanged (there is no slippage) or tends to increase. It is assumed that step S225 is continuously performed during the operation of the substrate processing apparatus 200.

When it is determined in step S225 that the deviation amount tends to remain unchanged, the controller 17 gives feedback to increase the transfer speed of the transfer robot 16. On the other hand, if it is determined in step S225 that the deviation amount tends to increase, the controller 17 gives feedback to decrease the transfer speed of the transfer robot 16. In other words, the controller 17 controls the transfer speed of the transfer robot 16 based on the vertex data of the deviation amount in step S225 (step S226). In this manner, in the second embodiment, the feedback of the transfer speed in a specific transfer path is performed based on the tendency of change in the deviation amount measured in the corresponding transfer path. In other words, also in the substrate processing apparatus 200 of the second embodiment, the operation speed of the transfer robot 16 can be optimized depending on the slippage amount of the wafer W for each transfer path.

Third Embodiment

Although the case of transferring the wafer W (substrate) as an object to be transferred has been described in the above-described first and second embodiments, the present disclosure may also be applied to the case of transferring a consumable part in the substrate processing chamber 15. Further, although the substrate processing apparatuses 10 and 200 that optimize the operation speed of the transfer robot 16 in the substrate transfer chamber 14 of a vacuum atmosphere are used in the above-described first and second embodiments, the present disclosure may also be applied to a substrate processing apparatus that optimizes the operation speed of the transfer robot in the loader chamber 12 of an atmospheric pressure atmosphere. Such an embodiment will be described as a third embodiment. Like reference numerals will be used for like parts as those of the substrate processing apparatus 10 of the first embodiment, the description of redundant components and operations will be omitted.

Figure 18:
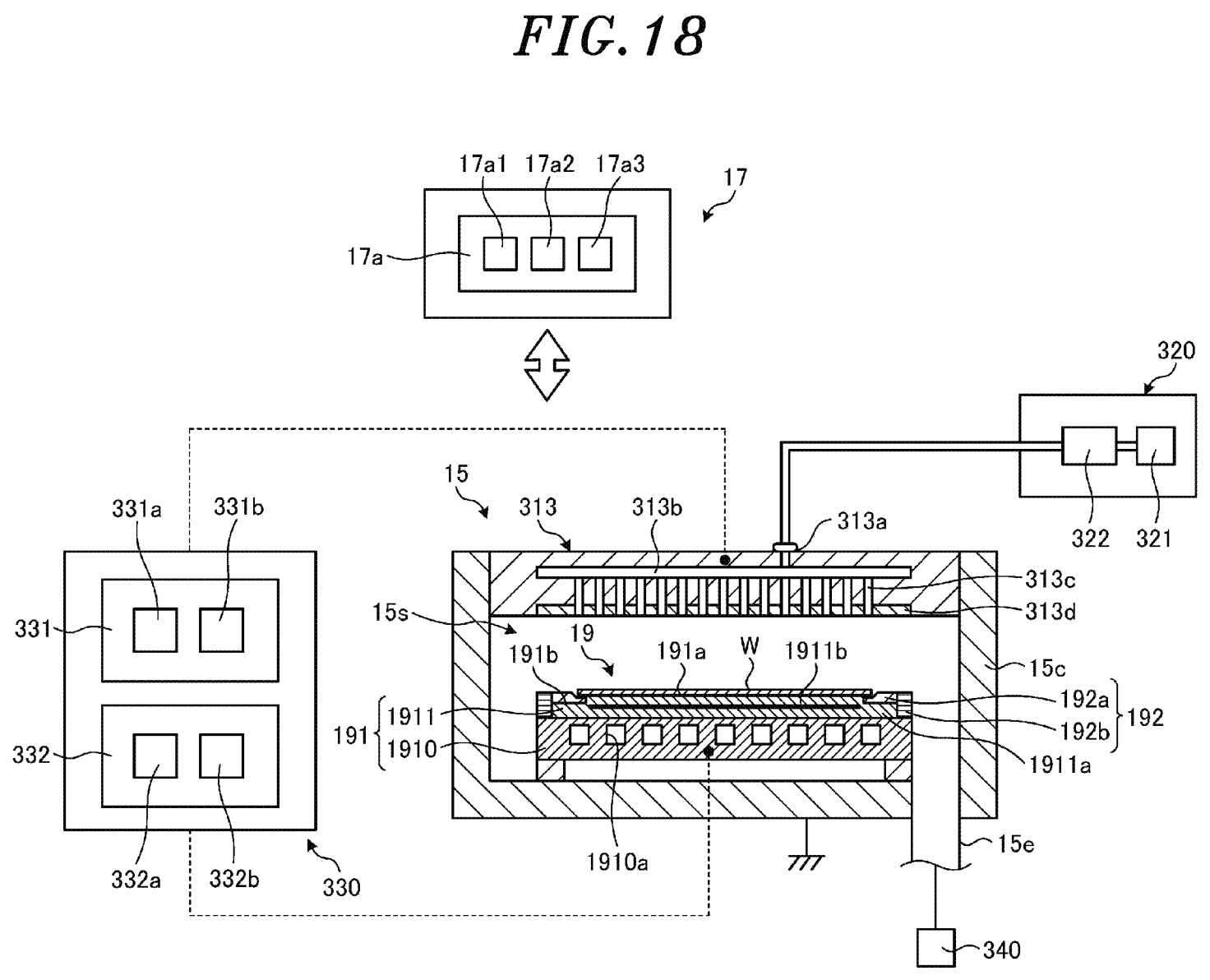

First, the substrate processing chamber 15 including consumable parts to be transferred will be described with reference to FIG. 18. FIG. 18 shows an example of the configuration of the substrate processing chamber of the third embodiment. As shown in FIG. 18, the substrate processing chamber 15 is controlled by the controller 17. The substrate processing chamber 15 is an example of a capacitively coupled plasma processing apparatus. A gas supply part 320, a power supply part 330, and an exhaust system 340 are disposed outside the substrate processing chamber 15. The substrate processing chamber 15 is a plasma processing chamber, and includes a placing table (hereinafter, also referred to as "substrate supporting portion") 19 and a gas introducing part. The gas introducing part is configured to introduce at least one processing gas into the substrate processing chamber 15. The gas introducing part includes a shower head 313. The substrate supporting portion 19 is disposed in the substrate processing chamber 15. The shower head 313 is disposed above the substrate supporting portion 19. In one embodiment, shower head 313 forms at least a part of the ceiling of substrate processing chamber 15. The substrate processing chamber 15 has a plasma processing space 15*s* defined by the shower head 313, a sidewall 15*c* of the substrate processing chamber 15, and the substrate supporting portion 19. The substrate processing chamber 15 has at least one gas supply port for supplying at least one processing gas to the plasma processing space 15*s* and at least one gas exhaust port for exhausting a gas from the plasma processing space. The substrate processing chamber 15 is grounded. The shower head 313 and the substrate supporting portion 19 are electrically insulated from the housing of substrate processing chamber 15.

The substrate supporting portion 19 includes a main body 191 and a ring assembly 192. The main body 191 has a central region 191*a* for supporting the wafer W and an annular region 191*b* for supporting the ring assembly 192. The annular region 191*b* of the main body 191 surrounds the central region 191*a* of the main body 191 in plan view. The wafer W is disposed on the central region 191*a* of the main body 191, and the ring assembly 192 is disposed on the annular region 191*b* of the main body 191 to surround wafer W on the central region 191*a* of the main body 191. Therefore, the central region 191*a* is also referred to as "substrate supporting surface" for supporting the wafer W, and the annular region 191*b* is also referred to as "ring supporting surface" for supporting the ring assembly 192.

In one embodiment, the main body 191 includes a base 1910 and an electrostatic chuck 1911. The base 1910 includes a conductive member. The conductive member of the base 1910 may serve as a lower electrode. The electrostatic chuck 1911 is disposed on the base 1910. The electrostatic chuck 1911 includes a ceramic member 1911*a* and an electrostatic electrode 1911*b* disposed in the ceramic member 1911*a*. The ceramic member 1911*a* has a central region 191*a*. In one embodiment, ceramic member 1911*a* also has the annular region 191*b*. Another member surrounding the electrostatic chuck 1911, such as an annular electrostatic chuck or an annular insulating member, may have the annular region 191*b*. Further, a part of the outer edge of the base 1910 may be included in the annular region 191*b*. In this case, the ring assembly 192 may be placed on the annular electrostatic chuck or the annular insulating member, or may be placed on both the electrostatic chuck 1911 and the annular insulating member. Similarly, the ring assembly 192 may be partially disposed on the outer edge of base 1910. Further, at least one RF/DC electrode coupled to a radio frequency (RF) power supply 331 and/or a direct current (DC) power supply 332, which will be described later, may be disposed in the ceramic member 1911*a*. In this case, at least one RF/DC electrode serves as the lower electrode. If a bias RF signal and/or a DC signal, which will be described later, is supplied to at least one RF/DC electrode, the RF/DC electrode is also referred to as "bias electrode." The conductive member of the base 1910 and at least one RF/DC electrode may serve as multiple lower electrodes. The electrostatic electrode 1911*b* may serve as the lower electrode. Accordingly, the substrate supporting portion 19 includes at least one lower electrode.

The ring assembly 192 includes one or multiple annular members. In one embodiment, one or multiple annular members include one or multiple edge rings 192*a* and at least one cover ring 192*b*. The edge ring 192*a* is made of a conductive material or an insulating material, and the cover ring 192*b* is made of an insulating material. The edge ring 192*a* and the cover ring 192*b* are examples of replaceable consumable parts.

The substrate supporting portion 19 may include a temperature control module configured to adjust at least one of the electrostatic chuck 1911, the ring assembly 1912, and the wafer W to a target temperature. The temperature control module may include a heaters, a heat transfer medium, a channel 1910*a*, or a combination thereof. A heat transfer fluid, such as brine or gas, flows through the channel 1910*a*. In one embodiment, the channel 1910*a* is formed in the base 1910, and one or multiple heaters are disposed in the ceramic member 1911*a* of the electrostatic chuck 1911. Further, the substrate supporting portion 19 may include a heat transfer gas supply part configured to supply a heat transfer gas to the gap between the backside of the wafer W and the central region 191*a*.

The shower head 313 is configured to introduce at least one processing gas from the gas supply part 320 into the plasma processing space 15*s*. The shower head 313 has at least one gas supply port 313*a*, at least one gas diffusion space 313*b*, multiple gas inlet ports 313*c*, and an upper electrode 313*d*. The processing gas supplied to the gas supply port 313*a* passes through the gas diffusion space 313*b* and is introduced into the plasma processing space 15*s* through the gas inlet ports 313*c*. The upper electrode 313*d* is an example of a replaceable consumable part. The gas introducing part may include, in addition to the shower head 313, one or more side gas injectors (SGI) attached to one or multiple openings formed in the sidewall 15*c*.

The gas supply part 320 may include at least one gas source 321 and at least one flow rate controller 322. In one embodiment, the gas supply part 320 is configured to supply at least one processing gas from the corresponding gas source 321 to shower head 313 through the corresponding flow rate controller 322. The flow rate controllers 322 may include, for example, a mass flow controller or a pressure-controlled flow rate controller. The gas supply part 320 may include one or more flow modulation devices for modulating the flow of at least one processing gas or causing it to pulsate.

The power supply part 330 includes an RF power supply 331 coupled to the substrate processing chamber 15 via at least one impedance matching circuit. The RF power supply 331 is configured to supply at least one RF signal (RF power) to at least one lower electrode and/or at least one upper electrode. Accordingly, plasma is produced from at least one processing gas supplied to the plasma processing space 15*s*. Hence, the RF power source 331 may serve as at least a part of a plasma generator configured to generate plasma from one or more processing gases in the substrate processing chamber 15. By supplying a bias RF signal to at least one lower electrode, a bias potential is generated at the wafer W, and ions in the generated plasma can be attracted to the wafer W.

In one embodiment, the RF power supply 331 includes a first RF generator 331*a* and a second RF generator 331*b*. The first RF generator 331*a* is coupled to at least one lower electrode and/or at least one upper electrode via at least one impedance matching circuit, and is configured to generate a source RF signal (source RF power) for plasma generation. In one embodiment, the source RF signal has a frequency within a range of 10 MHz to 150 MHz. In one embodiment, the first RF generator 331*a* may be configured to generate multiple source RF signals having different frequencies. The generated one or multiple source RF signals are supplied to at least one lower electrode and/or at least one upper electrode.

The second RF generator 331*b* is coupled to at least one lower electrode via at least one impedance matching circuit, and us configured to generate a bias RF signal (bias RF power). The frequency of the bias RF signal may be the same as or different from the frequency of the source RF signal. In one embodiment, the bias RF signal has a frequency lower than the frequency of the source RF signal. In one embodiment, the bias RF signal has a frequency within a range of 100 kHz to MHz. In one embodiment, the second RF generator 331*b* may be configured to generate multiple bias RF signals having different frequencies. The generated one or multiple bias RF signals are supplied to at least one lower electrode. In various embodiments, at least one of the source RF signal and the bias RF signal may pulsate.

The power supply part 330 may include the DC power supply 332 coupled to the substrate processing chamber 15. The DC power supply 332 includes a first DC generator 332*a* and a second DC generator 332*b*. In one embodiment, the first DC generator 332*a* is connected to the at least one lower electrode, and is configured to generate a first DC signal. The generated first bias DC signal is applied to at least one lower electrode. In one embodiment, the second DC generator 332*b* is connected to the at least one upper electrode, and is configured to generate a second DC signal. The generated second DC signal is applied to at least one upper electrode.

In various embodiments, at least one of the first and second DC signals may pulsate. In this case, a sequence of voltage pulses is applied to at least one lower electrode and/or at least one upper electrode. The voltage pulse may have a rectangular pulse waveform, a trapezoidal pulse waveform, a triangular pulse waveform, or a combination thereof. In one embodiment, a waveform generator for generating a sequence of voltage pulses from a DC signal is connected between the first DC generator 332*a* and the at least one lower electrode. Therefore, the first DC generator 332*a* and the waveform generator constitute a voltage pulse generator. When the second DC generator 332*b* and the waveform generator constitute the voltage pulse generator, the voltage pulse generator is connected to at least one upper electrode. The voltage pulse may have positive polarity or negative polarity. Further, the sequence of voltage pulses may include one or more positive voltage pulses and one or more negative voltage pulses in one cycle. The first and second DC generators 332*a* and 332*b* may be provided in addition to the RF power supply 331, or the first DC generator 332*a* may be provided instead of the second RF generator 331*b*.

The exhaust system 340 can be connected to a gas exhaust port 15*e* disposed at the bottom portion of the substrate processing chamber 15, for example. The exhaust system 340 may include a pressure control valve and a vacuum pump. The pressure control valve adjusts a pressure in the plasma processing space 15*s*. The vacuum pump may include a turbo molecular pump, a dry pump, or a combinations thereof.

The controller 17 processes computer-executable instructions that cause the substrate processing chamber 15 to perform various steps described in the present disclosure. The controller 17 may be configured to control individual components of the substrate processing chamber 15 to perform various steps described herein. In one embodiment, the controller 17 may be partially or entirely included in the substrate processing chamber 15. The controller 17 may include a processing part 17*a*1, a storage part 17*a*2, and a communication interface 17*a*3. The controller 17 is realized by, for example, a computer 17*a*. The processing part 17*a*1 may be configured to read a program from the storage part 17*a*2, and execute various control operations by executing the read program. The program may be stored in the storage part 17*a*2 in advance, or may be acquired via a medium when necessary. The acquired program is stored in the storage part 17*a*2, and read out from the storage part 17*a*2 and executed by the processing part 17*a*1. The medium may be various storage media readable by the computer 17*a*, or a communication line connected to the communication interface 17*a*3. The processing part 17*a*1 may be a central processing unit (CPU). The storage part 17*a*2 may include a random access memory (RAM), a read only memory (ROM), a hard disk drive (HDD), a solid state drive (SSD), or a combination thereof. The communication interface 17*a*3 may communicate with the substrate processing chamber 15 through a communication line such as a local area network (LAN) or the like.

<Configuration of Substrate Processing Apparatus 300 and Transfer Path>

Figure 19:
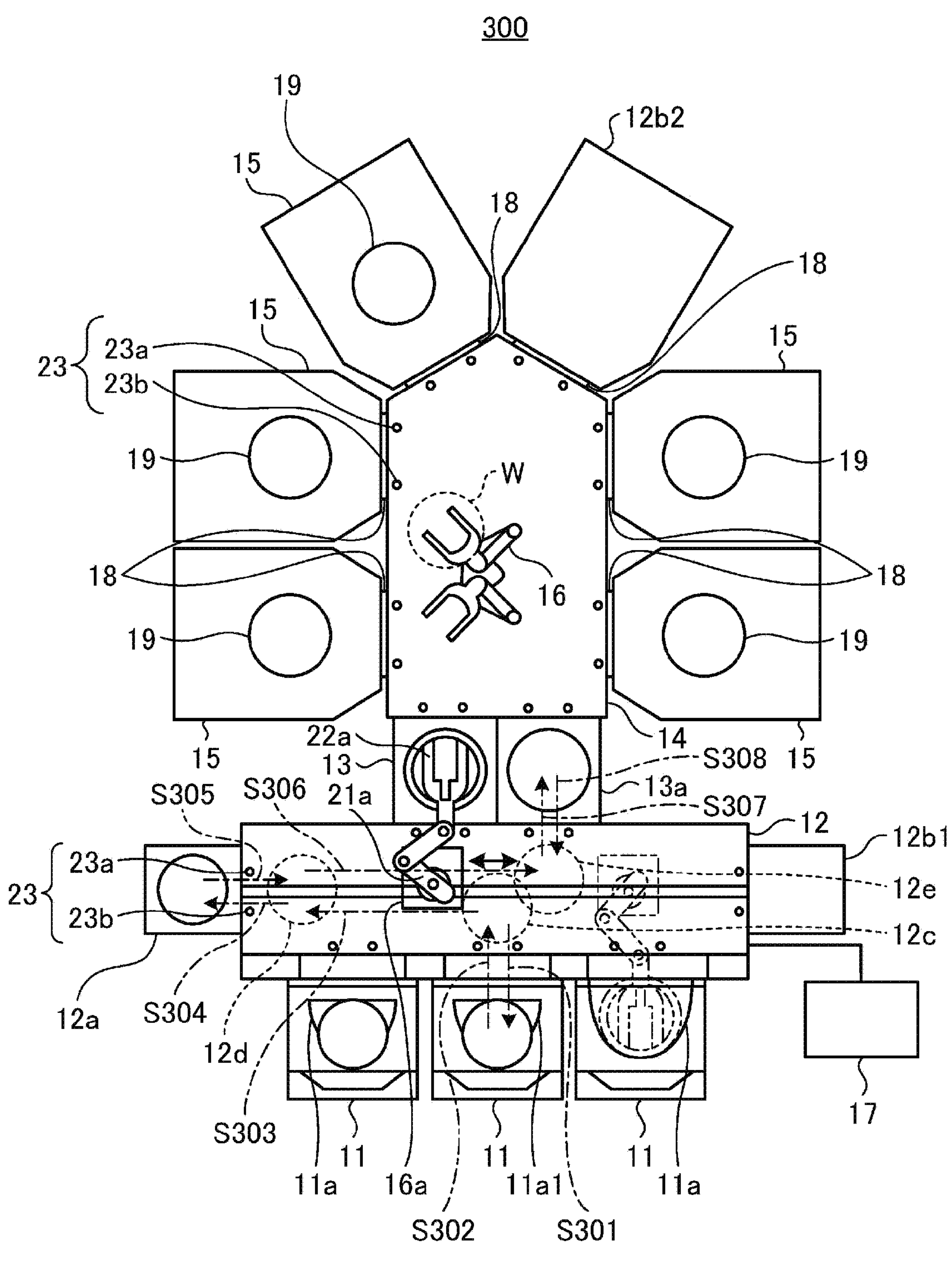
FIG. 19 shows an example of a transfer path in the third embodiment.

Next, the configuration of a substrate processing apparatus 300 according to the third embodiment and the measurement of the deviation amount in the transfer path of the object to be transferred on the atmospheric side will be described with reference to FIG. 19. FIG. 19 shows an example of the transfer path in the third embodiment. In the substrate processing apparatus 300 of FIG. 19, the load port 11 and the loader chamber 12 of the substrate processing apparatus 10 in the first embodiment are illustrated in detail. In the substrate processing apparatus 300, an alignment chamber 12*a* and a stocker 12*b*1 connected to the loader chamber 12 are illustrated. Further, in the substrate processing apparatus 300, one of the substrate processing chambers 15 in the substrate processing apparatus 10 of the first embodiment is replaced with the stocker 12*b*2.

A transfer robot 16*a* for transferring an object to be processed, such as the wafer W or the like, is disposed in the loader chamber 12. The transfer robot 16*a* is movable along the longitudinal direction of the loader chamber 12, and is rotatable, extensible/contractible, and vertically movable. The transfer robot 16*a* has an articulated arm 21*a*, and a fork 22*a* attached to the tip end of the articulated arm 21*a*. The fork 22*a* has a substantially U shape when viewed from the plane on which an object to be transferred such as the wafer W or the like is placed. The transfer robot 16*a* transfers the object to be transferred, such as the wafer W or the like, between the FOUP 11*a* placed on the load port 11, the alignment chamber 12*a*, and the load-lock chamber 13. When the object to be transferred is a consumable part in the substrate processing chamber 15, the transfer robot 16*a* transfers the consumable part to and from the stocker 12*b*1.

The alignment chamber 12*a* is connected to one lateral side surface of the loader chamber 12. However, the alignment chamber 12*a* may be connected to a longitudinal side surface of the loader chamber 12. Alternatively, the alignment chamber 12*a* may be disposed in the loader chamber 12. The alignment chamber 12*a* has a support table, an optical sensor (both not shown), and the like. Here, the alignment chamber is a device for detecting the position of the object to be transferred.

The stocker 12*b*1 is connected to the lateral side surface of the loader chamber 12 facing the alignment chamber 12*a*. However, the stocker 12*b*1 may be connected to the longitudinal side surface of the loader chamber 12. Alternatively, the stocker 12*b*1 may be disposed in the loader chamber 12. The stocker 12*b*1 stores, e.g., a consumable part in the substrate processing chamber 15, as the object to be transferred.

The stocker 12*b*2 is connected to the substrate transfer chamber 14 through the gate valve 18. When the inside of the stocker 12*bs* is maintained in a vacuum state, the object to be transferred is loaded into and unloaded from the stocker 12*b*2 by the transfer robot 16 of the substrate transport chamber 14. When the inside of the stocker 12*b*2 is opened to the atmosphere, the object to be transferred is loaded into and unloaded from the stocker 12*b*2 through a door (not shown) disposed on the side surface facing the gate valve 18, for example. Similarly to the stocker 12*b*1, the stocker 12*b*2 accommodates, e.g., a consumable part in the substrate processing chamber 15, as the object to be transferred.

Similarly to the substrate transfer chamber 14, in the loader chamber 12, the sensor pairs 23, each including two position sensors, are disposed in front of the load ports 11, the alignment chamber 12*a*, the stocker 12*b*1, and the load-lock chambers 13. Since the specific configuration of the sensor pair 23 and the deviation amount measuring method are the same as those of the first embodiment, the description thereof will be omitted.

Since the transfer method is also the same as that of the first embodiment, the description thereof will be omitted. In the third embodiment, the first placement chamber and the second placement chamber correspond to any one of the load port 11, the alignment chamber 12*a*, the stocker 12*a*1, and the load-lock chamber 13.

Steps S301 to S308 of FIG. 19 show the transfer path from the FOUP 11*a*1 of the load port 11 to the alignment chamber 12*a* and from the alignment chamber 12*a* to the load-lock chamber 13*a*, which is an example of the transfer path in the loader chamber 12. In describing the transfer path of FIG. 19, the wafer W is used as the object to be transferred.

First, the transfer robot 16*a* moves the fork 22*a* into the FOUP 11*a*1 from the standby position 12*c* of the FOUP 11*a*1 in the loader chamber 12 (step S301). The transfer robot 16*a* uses the fork 22*a* to obtain the wafer W from the FOUP 11*a*1 by the Get operation, and moves the fork 22*a* to the standby position 12*c* (step S302). At this time, the sensor pair 23 near the standby position 12*c* measures the deviation amount of the obtained wafer W from the reference position of the fork 22*a*.

The transfer robot 16*a* transfers the wafer W held by the forks 22*a* from the standby position 12*c* to the standby position 12*d* of the alignment chamber 12*a* by the Move operation (step S303). The transfer robot 16*a* places the wafer W held by the fork 22*a* on the support table of the alignment chamber 12*a* by the Put operation (step S304). At this time, the deviation amount of the wafer W from the reference position of the fork 22*a* is measured by the sensor pair 23 near the standby position 12*d*.

After the transfer robot 16*a* moves the fork 22*a* to the standby position 12*d*, the transfer robot 16*a* stands by until the detection of the position of the wafer W in the alignment chamber 12*a* is completed. The transfer robot 16*a* uses the fork 22*a* to obtain the wafer W from the alignment chamber 12*a* by the Get operation, and moves the fork 22*a* to the standby position 12*d* (step S305). At this time, the deviation amount of the wafer W from the reference position of the fork 22*a* is measured by the sensor pair 23 near the standby position 12*d*.

The transfer robot 16*a* transfers the wafer W held by the fork 22*a* from the standby position 12*d* to the standby position 12*e* of the load-lock chamber 13*a* by the Move operation (step S306). The transfer robot 16*a* places the wafer W held by the fork 22*a* in the load-lock chamber 13*a* by the Put operation (step S307). At this time, the deviation amount of the wafer W from the reference position of the fork 22*a* is measured by the sensor pair 23 near the standby position 12*e*. The transfer robot 16*a* moves the fork 22*a* to the standby position 12*e* (step S308). In this manner, in the third embodiment, the deviation amount of each transfer path of the wafer W is measured based on the measurement results of two of the sensor pair 23 near the load port 11, the alignment chamber 12*a*, and the load-lock chamber 13 that are examples of the placement chamber. As in the first embodiment, the controller 17 performs feedback of the transfer speed depending on to the measured deviation amount. In other words, in the third embodiment, also in the loader chamber 12 that is an atmospheric transfer chamber, the operation speed of the transfer robot 16*a* can be optimized depending on the slippage amount of the object to be transferred (the wafer W, the consumable part).

In the above embodiments, the slippage of the object to be transferred (the wafer W) is suppressed by the frictional force of the pads of the holders of the forks 22 and 22*a*. However, the present disclosure is not limited thereto. For example, in the case of using the pad capable of performing vacuum attraction in the fork 22*a* of the transfer robot 16*a*, the slippage may be suppressed by increasing the attraction force when the deviation amount increases.

In the above-described third embodiment, the transfer path of the wafer W as the object to be transferred has been described. However, the present disclosure is not limited thereto. For example, the present disclosure may be applied to the case of transferring a consumable part in the substrate processing chamber 15. In this case, the operation speeds of the transfer robots 16 and 16*a* can be optimized depending on the slippage amount of the consumable member in the transfer path where the consumable part is transferred from the substrate processing chamber 15 to the load-lock chamber 13 by the transfer robot 16 of the substrate transport chamber 14, and transferred from the load-lock chamber 13 to the stocker 12*a*1 by the transfer robot 16*a* of the loader chamber 12, for example. Similarly, the operation speeds of the transfer robots 16 and 16*a* can be optimized depending on the slippage amount of the consumable member in the transfer path where the consumable part is transferred from the stocker 12*a*1 to the load-lock chamber 13 via the alignment chamber 12*a* by the transfer robot 16*a*, and transferred from the load-lock chamber 13 to the substrate processing chamber 15 by the transfer robot 16.

Similarly, the operation speed of the transfer robot 16 can be optimized depending on the slippage amount of the consumable member in the transfer path where the consumable part in the substrate processing chamber 15 is transferred to the stocker 12*a*2 by the transfer robot 16 of the substrate transfer chamber 14, for example. Similarly, the operation speed of the transfer robot 16 can be optimized depending on the slippage amount of the consumable part in the transfer path where the consumable part in the stocker 12*a*2 is transferred to the substrate processing chamber 15 by the transfer robot 16.

Fourth Embodiment

In the above embodiments, the transfer speed is controlled using the acceleration. However, the transfer speed may be controlled using the maximum speed. Such an embodiment will be described as a fourth embodiment. Like reference numerals will be used for like parts as those of the substrate processing apparatuses 10 and 300 of the first and third embodiments, and the description of redundant components and operations will be omitted.

Figure 20:
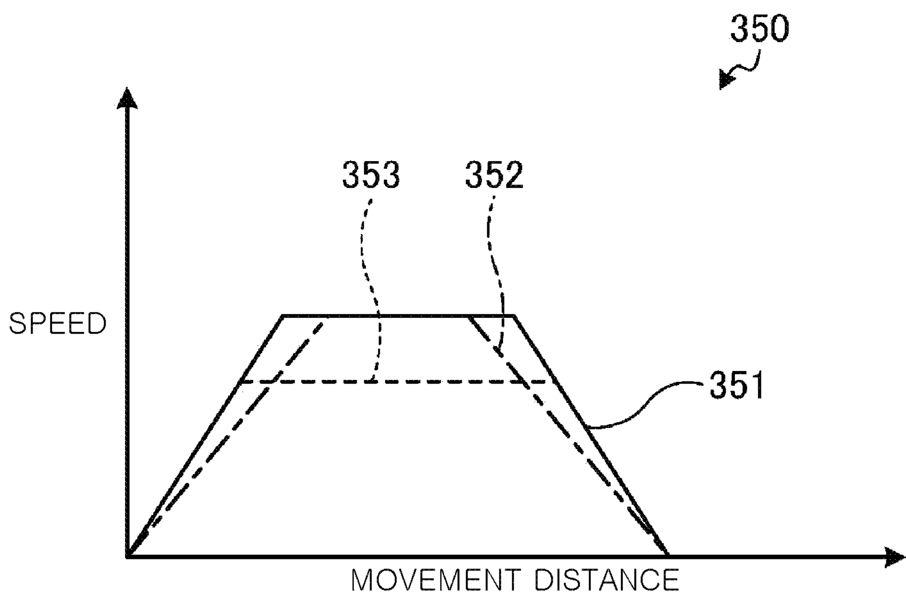
FIG. 20 shows an example of relationship between a speed of a transfer robot and a movement distance in a fourth embodiment.
Figure 21:
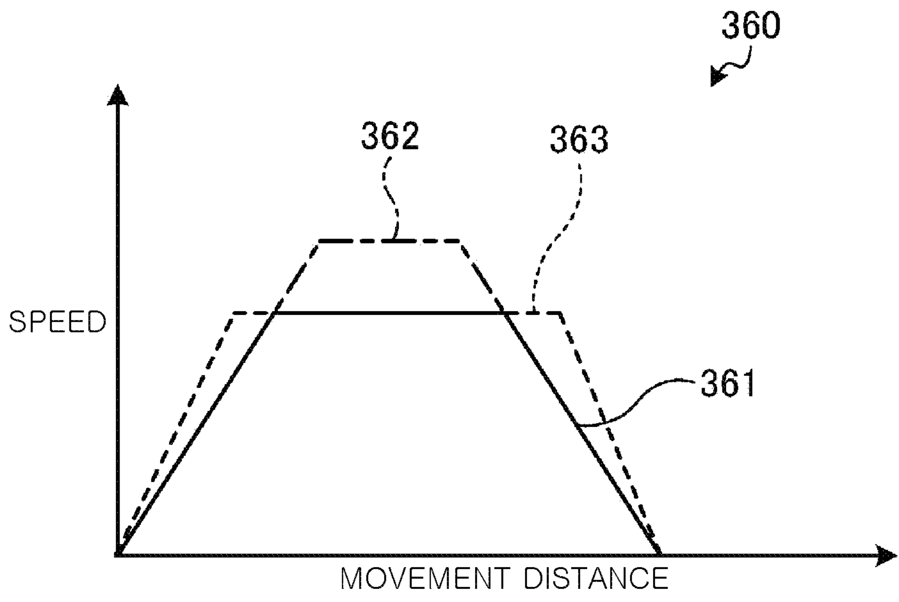
FIG. 21 shows an example of relationship between a speed of a transfer robot and a movement distance in the fourth embodiment.

FIGS. 20 and 21 show an example of the relationship between the speed of the transfer robot in the fourth embodiment and the movement distance. A graph 350 of FIG. 20 shows a case where the maximum speeds of the transfer robots 16 and 16*a* are regulated and the accelerations or the maximum speeds are limited. A graph 351 shows a case where the transfer robot accelerates at a reference acceleration, reaches a reference maximum speed, moves a predetermined distance while maintaining the maximum speed, decelerates at a reference deceleration (negative acceleration), and reaches a target position.

A graph 352 shows a case where the object to be transferred accelerates at an acceleration lower than the reference, reaches a reference maximum speed, moves a predetermined distance while maintaining the maximum speed, decelerates at a deceleration lower than the reference, and reaches a target position. A graph 353 shows a case where the object to be transferred accelerates at a reference acceleration, moves a predetermined distance while maintaining a speed lower than the reference maximum speed, decelerates at a reference deceleration, and reaches a target position. In other words, the graph 352 is a pattern obtained by changing only the acceleration from the graph 351, and Graph 353 is a pattern obtained by changing only the maximum speed from the graph 351. Alternatively, a pattern that changes both the acceleration and the maximum speed may be set. The control shown in the graphs 352 and 353 can be applied, for example, to the feedback for decreasing the transfer speed when the deviation amount exceeds the threshold.

A graph 360 of FIG. 21 shows a case where the accelerations or the maximum speeds of the transfer robots 16 and 16*a* are increased from the reference. Similarly to the graph 351, a graph 361 shows a case where the object to be transferred accelerates at a reference acceleration, reaches a reference maximum speed, moves a predetermined distance while maintaining the maximum speed, decelerates at a reference deceleration, and reaches a target position. A graph 362 shows a case where the object to be transferred accelerates at a reference acceleration, reaches a maximum speed higher than the reference, moves a predetermined distance while maintaining the maximum speed, decelerates at a reference deceleration, and reaches a target position. A graph 363 shows a case where the object to be transferred accelerates at an acceleration higher than the reference, moves a predetermined distance while maintaining the maximum speed, decelerates at a deceleration higher than the reference, and reaches a target position. In other words, the graph 362 is a pattern obtained by changing only the maximum speed from the graph 361, and the graph 363 is a pattern obtained by changing only the acceleration from the graph 361. Alternatively, a pattern that changes both the acceleration and the maximum speed may be set. The control shown in the graphs 362 and 363 can be applied, for example, to the feedback for increasing the transfer speed when the deviation amount is smaller than or equal to the threshold.

Different patterns of the transfer speed may be selected from the graphs 351 to 353 and 361 to 363, and the pattern with the shortest transfer time may be applied to the subsequent transfer. For example, several different patterns are selected from the graphs 351 to 353 and 361 to 363 at the start of a certain lot, and the wafers W are sequentially transferred using the selected different patterns. Among the selected patterns, the pattern with the shortest transfer time may be applied to the transfer of a subsequent wafer W in the corresponding lot or the transfer of a wafer W in a subsequent lot. In this manner, in the fourth embodiment, the transfer time of the transfer robots 16 and 16*a* can be further shortened. In other words, it is possible to further optimize the operations speed of the transfer robots 16 and 16*a*. The pattern with the shortest transfer time may be selected using the result obtained by calculating the transfer time of each pattern. The transfer speed patterns shown in the graphs 350 and 360 can also be applied to the case where the object to be transferred is a consumable part in the substrate processing chamber 15, other than the wafer W, for example.

Although the case where each of the substrate processing apparatuses 10, 200, and 300 has one substrate transfer chamber 14 has been described in the above embodiments. However, the present disclosure is not limited thereto, and may be applied to a case where two substrate transfer chambers 14 are connected to each other and a transfer module (path) for transferring a wafer W between the substrate transfer chambers 14 is provided.

In accordance with the first and third embodiments, the substrate processing apparatuses 10 and 300 include the first placement chambers 11*a*, 12*a*, 12*b*1, 13, and 15, the second placement chambers 11*a*, 12*a*, 12*b*1, 13, and 15, the transfer robots 16 and 16*a* for loading and unloading the object to be transferred between the first placement chamber and the second placement chamber, and the controller 17. a) The controller 17 is configured to control the substrate processing apparatus such that the position of the object to be transferred on the forks 22 and 22*a* of the transfer robots is detected, as a first position, in the case of unloading the object to be transferred (the wafer W, the consumable part) from the first placement chamber. b) The controller 17 is configured to control the substrate processing apparatus such that the object to be transferred is transferred to the standby position of the second placement chamber after the object to be transferred is unloaded from the first placement chamber to the standby position of the first placement chamber. c) The controller 17 is configured to control the substrate processing apparatus such that the position of the object to be transferred on the fork is detected, as a second position, in the case of loading the object to be transferred from the standby position of the second placement chamber to the second placement chamber. d) The controller 17 is configured to control the substrate processing apparatus such that the transfer speed of b) is controlled based on the first position and the second position. Accordingly, the operation speed of the transfer robot can be optimized depending on the slippage amount of the object to be transferred.

In accordance with the first and third embodiments, the position of the object to be transferred is detected by the position detection sensors (the sensor pair 23) disposed at the loading/unloading ports of the first placement chamber and the second placement chamber. Accordingly, the feedback of the transfer speed can be performed whenever the object to be transferred is transferred.

In accordance with the first and third embodiments, in d), the transfer speed is controlled based on the difference between the first position and the second position. Accordingly, the feedback of the transfer speed can be performed whenever the object to be transferred is transferred.

In accordance with the first and third embodiments, in d), the transfer speed is decreased when the difference exceeds the threshold. Accordingly, the feedback of the transfer speed can be performed whenever the object to be transferred is transferred.

In accordance with the first and third embodiments, in d), the transfer speed is increased when the difference is smaller than or equal to the threshold. Accordingly, the feedback of the transfer speed can be performed whenever the object to be transferred is transferred.

In accordance with the fourth embodiment, in d), one or both of the maximum speed and the acceleration are controlled as the transfer speed. Accordingly, the transfer time can be further reduced.

In accordance with the first and third embodiments, in d), the feedback of the transfer speed is performed when an object to be transferred is transferred on the same path as that of the object to be transferred. Accordingly, the transfer speed can be optimized for each transfer path.

In accordance with the first embodiment, the first placement chamber and the second placement chamber are any one of the load-lock module, the process module, and the transfer module. Accordingly, the transfer speed between the modules can be optimized.

In accordance with the third embodiment, the first placement chamber and the second placement chamber are any one of the load-lock module, the process module, and the transfer module. Accordingly, the transfer speed between the modules can be optimized.

In accordance with the embodiments, the object to be transferred is a substrate. Accordingly, the operation speed of the transfer robot can be optimized depending on the slippage amount of the substrate.

In accordance with the embodiments, the object to be transferred is one or multiple consumable parts selected among the focus ring, the cover ring, and the upper electrode. Accordingly, the operation speed of the transfer robot can be optimized depending on the slippage amount of the consumable member.

Further, in accordance with the second embodiment, the substrate processing apparatus 200 includes the first placement chambers 13 and 15, the second placement chambers 13 and 15, the transfer robot 16 for loading/unloading the object to be transferred (the wafer W) between the first placement chamber and the second placement chamber, the position detection sensor 223 for measuring the deviation amount of the object to be transferred from the reference position, and the controller 17. a) The controller 17 is configured to control the substrate processing apparatus 200 such that the object to be transferred is transferred from the standby position of the first placement chamber to the measurement position of the position detection sensor 223. b) The controller 17 is configured to control the substrate processing apparatus 200 such that the displacement amount is measured at the measurement position. c) The controller 17 is configured to control the substrate processing apparatus 200 such that the object to be transferred is transferred from the measurement position to the standby position of the second placement chamber. d) The controller 17 is configured to control the substrate processing apparatus 200 such that the transfer speeds of a) and c) are controlled based on the measured deviation amount. Accordingly, the operation speed of the transfer robot can be optimized depending on the slippage amount of the object to be transferred.

It should be noted that the embodiments of the present disclosure are illustrative in all respects and are not restrictive. The above-described embodiments may be omitted, replaced, or changed in various forms without departing from the scope of the appended claims and the gist thereof.

Although the case where the transfer robot 16 has two articulated arms 21 has been described in the above embodiments, the present disclosure is not limited thereto. For example, the transfer robot 16 may have one articulated arm 21 or three or more articulated arms 21.

The above-described embodiment may be appropriately combined without contradicting configurations and processing contents.

The invention claimed is:

1. A substrate processing apparatus comprising:

a first placement chamber;

a second placement chamber;

a transfer robot configured to load and unload an object to be transferred between the first placement chamber and the second placement chamber; and a controller including a central processing unit (CPU) and memory, wherein the controller is configured to:

a) control the substrate processing apparatus such that a position of the object to be transferred on a fork of the transfer robot is detected as a first position at the time of unloading the object to be transferred from the first placement chamber;

b) control the substrate processing apparatus such that the object to be transferred is unloaded from the first placement chamber to a standby position of the first placement chamber and then transferred to a standby position of the second placement chamber;

c) control the substrate processing apparatus such that a position of the object to be transferred on the fork is detected as a second position at the time of loading the object to be transferred from the standby position of the second placement chamber into the second placement chamber; and d) control the substrate processing apparatus such that a transfer speed of b) is controlled based on the first position and the second position, wherein in d), the transfer speed is controlled based on a difference between the first position and the second position, and in d), the transfer speed is decreased when the difference exceeds a threshold or in d), the transfer speed is increased when the difference is smaller than or equal to the threshold.

2. The substrate processing apparatus of claim 1, wherein the position of the object to be transferred is detected by position detection sensors disposed at loading/unloading ports of the first placement chamber and the second placement chamber.

3. The substrate processing apparatus of claim 1, wherein in d), one or both of a maximum speed and an acceleration is controlled as the transfer speed.

4. The substrate processing apparatus of claim 1, wherein the first placement chamber and the second placement chamber are any one of a load-lock module, a process module, and a transfer module.

5. The substrate processing apparatus of claim 1, wherein the first placement chamber and the second placement chamber are any one of a load port, an alignment chamber, a stocker, and a load-lock module.

6. The substrate processing apparatus of claim 1, wherein the object to be transferred is a substrate.

7. The substrate processing apparatus of claim 1, wherein the object to be transferred is one or multiple consumable parts selected among a focus ring, a cover ring, and an upper electrode.

8. A transfer method in a substrate processing apparatus, wherein the substrate processing apparatus includes:

a first placement chamber;

a second placement chamber; and a transfer robot configured to load and unload an object to be transferred between the first placement chamber and the second placement chamber, the transfer method comprising:

a) detecting a position of the object to be transferred on a fork of the transfer robot as a first position at the time of unloading the object to be transferred from the first placement chamber;

b) unloading the object to be transferred from the first placement chamber to a standby position of the first placement chamber and then transferring the object to be transferred to a standby position of the second placement chamber;

c) detecting a position of the object to be transferred on the fork as a second position at the time of loading the object to be transferred into the second placement chamber from the standby position of the second placement chamber; and d) controlling a transfer speed of b) based on the first position and the second position, wherein in d), the transfer speed is controlled based on a difference between the first position and the second position, and in d), the transfer speed is decreased when the difference exceeds a threshold or in d), the transfer speed is increased when the difference is smaller than or equal to the threshold.

* * * * *